US012765079B2

(12) United States Patent
Matsumoto et al.

(10) Patent No.: US 12,765,079 B2
(45) Date of Patent: Oct. 13, 2026

(54) SOLAR CELL MODULE INSULATION FILM, INSULATION FILM WITH STEEL SHEET, INSULATION FILM WITH WIRING SHEET, AND SOLAR CELL MODULE

(71) Applicant: DAI NIPPON PRINTING CO., LTD., Tokyo-to (JP)

(72) Inventors: Yuji Matsumoto, Tokyo-to (JP); Keita Arihara, Tokyo-to (JP); Yasushi Shirahige, Tokyo-to (JP); Atsushi Nakahara, Tokyo-to (JP); Taiki Takayama, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 95 days.

(21) Appl. No.: 18/697,215

(22) PCT Filed: Oct. 3, 2022

(86) PCT No.: PCT/JP2022/036974

§ 371 (c)(1),
(2) Date: Sep. 17, 2024

(87) PCT Pub. No.: WO2023/054730

PCT Pub. Date: Apr. 6, 2023

(65) Prior Publication Data

US 2025/0324774 A1 Oct. 16, 2025

(30) Foreign Application Priority Data

Oct. 1, 2021 (JP) ................................ 2021-162607
Oct. 1, 2021 (JP) ................................ 2021-162613

(51) Int. Cl.
*H10F 19/90* (2025.01)
*B32B 3/26* (2006.01)
(Continued)

(52) U.S. Cl.
CPC ........... *H10F 19/906* (2025.01); *B32B 3/266* (2013.01); *B32B 7/02* (2013.01); *B32B 7/12* (2013.01);
(Continued)

(58) Field of Classification Search
CPC ........ H10F 19/80; H10F 19/85; H10F 19/804; H10F 19/906; B32B 2457/12; B32B 15/18; B32B 15/085; B32B 27/32; B32B 27/08
See application file for complete search history.

(56) References Cited

U.S. PATENT DOCUMENTS

| | | | | |
|---|---|---|---|---|
| 2008/0053512 | A1* | 3/2008 | Kawashima | H10F 19/85 136/244 |
| 2014/0096825 | A1* | 4/2014 | Bonekamp | H10F 19/85 156/182 |
| 2022/0203654 | A1* | 6/2022 | Kadowaki | B32B 15/18 |

FOREIGN PATENT DOCUMENTS

| | | | | |
|---|---|---|---|---|
| CN | 104393074 A | 3/2015 | | |
| EP | 0019835 A1 | * 12/1980 | | B32B 15/18 |

(Continued)

OTHER PUBLICATIONS

JP 2016178154A English machine translation (Year: 2016).*
KR-101480032-B1 English machine translation (Year: 2015).*
JP2015192101A English machine translation (Year: 2015).*

*Primary Examiner* — Andrew J Golden
(74) *Attorney, Agent, or Firm* — Oliff PLC

(57) ABSTRACT

A solar cell module insulation film disposed between a solar cell and a steel sheet in a solar cell module, the solar cell module insulation film including: a sealing material layer, an insulating substrate, and a polyethylene-based resin layer, in this order, wherein the polyethylene-based resin layer is a polyethylene film; and a wetting tension of a surface of the
(Continued)

polyethylene-based resin layer that is opposite side to the insulating substrate is 36 dyne/cm or more.

15 Claims, 4 Drawing Sheets

(51) Int. Cl.

| | |
|---|---|
| ***B32B 7/02*** | (2019.01) |
| ***B32B 7/12*** | (2006.01) |
| ***B32B 15/085*** | (2006.01) |
| ***B32B 15/18*** | (2006.01) |
| ***B32B 15/20*** | (2006.01) |
| ***B32B 27/08*** | (2006.01) |
| ***B32B 27/16*** | (2006.01) |
| ***B32B 27/18*** | (2006.01) |
| ***B32B 27/32*** | (2006.01) |
| ***B32B 27/36*** | (2006.01) |
| ***C08J 5/12*** | (2006.01) |

(52) U.S. Cl.

CPC ............ *B32B 15/085* (2013.01); *B32B 15/18* (2013.01); *B32B 15/20* (2013.01); *B32B 27/08* (2013.01); *B32B 27/16* (2013.01); *B32B 27/18* (2013.01); *B32B 27/32* (2013.01); *B32B 27/36* (2013.01); *C08J 5/124* (2013.01); *B32B 2270/00* (2013.01); *B32B 2307/4026* (2013.01); *B32B 2307/412* (2013.01); *B32B 2307/70* (2013.01); *B32B 2307/736* (2013.01); *B32B 2307/7376* (2023.05); *B32B 2457/12* (2013.01); *C08J 2323/06* (2013.01); *C08J 2323/26* (2013.01); *C08J 2367/02* (2013.01)

(56) References Cited

FOREIGN PATENT DOCUMENTS

| | | | | | |
|---|---|---|---|---|---|
| EP | 2833416 | A1 | | 2/2015 | |
| JP | 2001-036108 | A | | 2/2001 | |
| JP | 2003-046105 | A | | 2/2003 | |
| JP | 2008-053420 | A | | 3/2008 | |
| JP | 2012-94845 | A | | 5/2012 | |
| JP | 2012-164962 | A | | 8/2012 | |
| JP | 2012-204459 | A | | 10/2012 | |
| JP | 2012-234965 | A | | 11/2012 | |
| JP | 2013-65708 | A | | 4/2013 | |
| JP | 2014-192385 | A | | 10/2014 | |
| JP | 5638378 | B2 | | 12/2014 | |
| JP | 2015-192101 | A | | 11/2015 | |
| JP | 2016178154 | A | * | 10/2016 | |
| JP | 6286736 | B2 | | 3/2018 | |
| KR | 101480032 | B1 | * | 1/2015 | ........... H10F 19/804 |
| WO | WO-2021006024 | A1 | * | 1/2021 | ............. B32B 15/18 |

* cited by examiner

SOLAR CELL MODULE INSULATION FILM, INSULATION FILM WITH STEEL SHEET, INSULATION FILM WITH WIRING SHEET, AND SOLAR CELL MODULE

TECHNICAL FIELD

The present disclosure relates to a solar cell module insulation film disposed between a solar cell and a steel sheet in a steel sheet integrated solar cell module, an insulation film with a steel sheet using thereof, and a solar cell module.

Also, the present disclosure relates to a solar cell module insulation film disposed between a solar cell and a wiring sheet in a solar cell module, an insulation film with wiring sheet using thereof, and a solar cell module.

BACKGROUND ART

In recent years, global warming caused by carbon dioxide has been a problem in worldwide. To this problem, solar cells utilizing solar energy which is environmentally friendly has been focused, and positive research and development thereof has been advanced.

Recently, the development of building material integrated solar cell module, in which solar cells are integrated with building materials such as a roof material, an outer wall and a window has been actively carried out for the purposes of improving workability, design, and appearance, and reducing the construction cost (for example, see Patent Documents 1 to 5).

There are various types of solar cells, and for example, a back contact type solar cell, in which a plurality of electrodes having different polarities are disposed on a non-light receiving surface for improving efficiency of receiving sunlight, has been known.

Meanwhile, a general structure of a solar cell module including the back contact type solar cell is, for example, a structure in which a transparent substrate, a first sealing material sheet, a back contact type solar cell, a second sealing material sheet, a wiring sheet and a backside protective sheet are layered in the order, wherein a penetration hole is formed in the second sealing material sheet, and a conductive part, which electronically connects the back contact type solar cell with a wiring of the wiring sheet, is arranged in the penetration hole (for example, see Patent Document 6).

Further, in general, as a method for producing the solar cell module including the back contact type solar cell, a method known is layering the transparent substrate, the first sealing material sheet, the back contact type solar cell, the second sealing material sheet, the wiring sheet, and the backside protective sheet, and then integrating thereof by a thermal compression.

CITATION LIST

Patent Documents

Patent Document 1: Japanese Patent Application Laid-Open (JP-A) No. 2015-192101
Patent Document 2: JP-A No. 2012-204459
Patent Document 3: JP-A No. 2001-36108
Patent Document 4: Japanese Patent No. 5638378
Patent Document 5: JP-A No. 2008-53420
Patent Document 6: Japanese Patent No. 6286736

SUMMARY

Technical Problem

For example, Patent Document 1 and Patent Document 2 disclose a steel sheet integrated type solar cell module including a frontside protective sheet, a sealing material sheet, a solar cell, a sealing material sheet, and a steel sheet in this order. However, in such a structure, after layering the frontside protective sheet, the sealing material sheet, the solar cell, the sealing material sheet, and the steel sheet, on the occasion of integrating those sheets by the thermal compression, since the thickness of the sealing material sheet disposed between the solar cell and the steel sheet is reduced, insulation of the solar cell and the steel sheet may be insufficient.

Also, for example, Patent Document 2 and Patent Document 3 disclose a steel sheet integrated type solar cell module including a frontside protective sheet, a sealing material sheet, a solar cell, a sealing material sheet, a resin film, a sealing material sheet, and a steel sheet, in this order. In general, the thickness of the sealing material sheet is comparatively thick, and for example, as a sealing material sheet disposed between the solar cell and the steel sheet in Example 10 of Patent Document 2, 400 μm thick ethylene-vinyl acetate copolymer film is used, and as a sealing material sheet disposed between the solar cell and the steel sheet in Example 1 of Patent Document 3, 500 μm thick ethylene-vinyl acetate copolymer film is used. In such a structure, since the thickness of the sealing material sheet disposed between the solar cell and the steel sheet is thick, it is difficult to decrease the thickness of the solar cell module.

Also, in the above described structure, the frontside protective sheet, the sealing material sheet, the solar cell, the sealing material sheet, the resin film, the sealing material sheet, and the steel sheet are respectively prepared, and these materials are layered in the order, then integrated by a thermal compression to produce a solar cell module. In such a case, materials at the time of layering vary, and operation of layering these materials by overlapping them in a specified position is complicated and the number of processes is a lot, and thus it is inferior in productivity and expensive in cost.

Also, for example, Patent Document 4 and Patent Document 5 disclose a steel sheet integrated type solar cell module including a solar cell module, an adhesive agent layer, and a steel sheet in this order. However, in the case of such a structure, a step of pasting an adhesive agent is required, and there are problems such that the productivity significantly decreases and the cost increases.

Also, adhesion with the steel sheet is required for the steel sheet integrated type solar cell module.

The first aspect of the present disclosure has been made in view of the above circumstances and a main object thereof is to provide a solar cell module insulation film superior in adhesion to a steel sheet and in insulation.

Meanwhile, on the occasion of producing the solar cell module including the back contact type solar cell, a penetration hole is formed in the sealing material sheet disposed between the back contact type solar cell and the wiring sheet, but in a process of integration by a thermal compression, there is a problem such that the sealing material sheet thermally contracts and the position of the penetration hole in the sealing material sheet is deviated relative to the electrode of the back contact type solar cell and to the wiring of the wiring sheet. When the positional deviation of the penetration hole of the sealing material sheet occurs, conduction in the electrode of the back contact type solar cell and the wiring of the wiring sheet becomes insufficient, and reliability decreases.

Also, to the sealing material sheet disposed in the wiring sheet side, adhesion to the wiring sheet, particularly adhesion to the wiring of the wiring sheet is required.

The second aspect of the present disclosure has been made in view of the above circumstances and a main object thereof is to provide a solar cell module insulation film superior in size stability and in adhesion to the wiring of the wiring sheet.

Solution to Problem

The first embodiment in the first aspect of the present disclosure provides a solar cell module insulation film disposed between a solar cell and a steel sheet in a solar cell module, the solar cell module insulation film including: a sealing material layer, an insulating substrate, and a polyethylene-based resin layer, in this order, wherein the polyethylene-based resin layer is a polyethylene film; and a wetting tension of a surface of the polyethylene-based resin layer that is opposite side to the insulating substrate is 36 dyne/cm or more.

Another embodiment of the present aspect provides a solar cell module insulation film disposed between a solar cell and a steel sheet in a solar cell module, the solar cell module insulation film including: a sealing material layer, an insulating substrate, and a polyethylene-based resin layer, in this order, wherein a thickness of the polyethylene-based resin layer is 50 μm or more and 300 μm or less; and a wetting tension of a surface of the polyethylene-based resin layer that is opposite side to the insulating substrate is 36 dyne/cm or more.

Another embodiment of the present aspect provides an insulation film with a steel sheet including: the above described solar cell module insulation film; and a steel sheet disposed on a surface of the solar cell module insulation film that is a polyethylene-based resin layer side.

Another embodiment of the present aspect provides a solar cell module including a transparent substrate, a sealing material sheet, a solar cell, the above described solar cell module insulation film, and a steel sheet in this order.

The first embodiment in the second aspect of the present disclosure provides a solar cell module insulation film disposed between a solar cell and a steel sheet in a solar cell module, the solar cell module insulation film including: an insulating substrate of which rate of dimensional change in a MD direction is 2.0% or less and thermal shrinkage in a TD direction is 1.5% or less, when kept at 150° C. for 30 minutes in accordance with JIS-K-7133-1999; and a wiring sheet side sealing material layer that is disposed on one surface of the insulating substrate and includes a polyethylene layer, wherein a wetting tension of a surface of the polyethylene layer that is opposite side to the insulating substrate is 36 dyne/cm or more.

Another embodiment of the present aspect provides a solar cell module insulation film disposed between a solar cell and a wiring sheet in a solar cell module, the solar cell module insulation film including: an insulating substrate containing at least one kind of resins selected from the group consisting of a polyethylene terephthalate, a polyethylene naphthalate, a polybutylene terephthalate, a polyimide, a polyamide, a polycarbonate, and a modified polyphenylene ether; and a wiring sheet side sealing material layer that is disposed on one surface of the insulating substrate and includes a polyethylene layer, wherein a wetting tension of a surface of the polyethylene layer that is opposite side to the insulating substrate is 36 dyne/cm or more.

Another embodiment of the present aspect provides a solar cell module insulation film disposed between a solar cell and a wiring sheet in a solar cell module, the solar cell module insulation film including: an insulating substrate of which thermal shrinkage in a MD direction is 2.0% or less and in a TD direction is 1.5% or less, when kept at 150° C. for 30 minutes; and a wiring sheet side sealing material layer that is disposed on one surface of the insulating substrate and includes a polyethylene layer containing a silane modified resin, wherein a content of silicon atoms in the polyethylene layer is 0.0001 mass % or more and 15.0 mass % or less.

Another embodiment of the present aspect provides a solar cell module insulation film disposed between a solar cell and a wiring sheet in a solar cell module, the solar cell module insulation film including: an insulating substrate containing at least one kind of resins selected from the group consisting of a polyethylene terephthalate, a polyethylene naphthalate, a polybutylene terephthalate, a polyimide, a polyamide, a polycarbonate, and a modified polyphenylene ether; and a wiring sheet side sealing material layer that is disposed on one surface of the insulating substrate and includes a polyethylene layer containing a silane modified resin, wherein a content of silicon atoms in the polyethylene layer is 0.0001 mass % or more and 15.0 mass % or less.

Another embodiment of the present aspect provides an insulation film with wiring sheet including: the above described solar cell module insulation film; and a wiring sheet disposed on a surface of the solar cell module insulation film that is a wiring sheet side sealing material layer side.

Another embodiment of the present aspect provides a solar cell module including a transparent substrate, a sealing material sheet, a solar cell, the above described solar cell module insulation film, and a wiring sheet in this order.

Advantageous Effects

The first aspect of the present disclosure can provide a solar cell module insulation film superior in adhesion to a steel sheet and in insulation.

The second aspect of the present disclosure can provide a solar cell module insulation film superior in size stability and in adhesion to the wiring of the wiring sheet.

DESCRIPTION OF EMBODIMENTS

Embodiments of the present disclosure will be explained as below with reference to, for example, drawings. However, the present disclosure is enforceable in a variety of different forms, and thus should not be taken as is limited to the contents described in the embodiment exemplified as below. Also, the drawings may show the features of the invention such as width, thickness, and shape of each part schematically in order to explain the invention more clearly in some cases comparing to the actual form; however, it is merely an example, and thus does not limit the interpretation of the present disclosure. Also, in the present description and each drawing, for the factor same as that described in the figure already explained, the same reference sign is indicated and the explanation thereof may be omitted.

In the present description, upon expressing an aspect of arranging one member on the other member, when it is expressed simply "on" or "below", both of when the other member is directly arranged on or below the one member so as to contact with each other, and when the other member is arranged on or below the one member further interposing an additional member, can be included unless otherwise described. Furthermore, in the present description, upon expressing an aspect of arranging the other member in a surface of one member, when expressed simply "in a surface", both of when the other member is directly arranged on or below the one member so as to contact with each other, and when the other member is arranged on or below the one member further interposing an additional member, can be included unless otherwise described.

In the present disclosure, there are two aspects as described above. Each of them will be hereinafter explained separately.

α. First Aspect

First, the solar cell module insulation film, the insulation film with steel sheet, and the solar cell module in the first aspect of the present disclosure will be explained in details.

A. Solar Cell Module Insulation Film

The solar cell module insulation film in the present aspect is a member disposed between a solar cell and a steel sheet in a solar cell module, and includes a sealing material layer, an insulating substrate, and a polyethylene-based resin layer in this order. The solar cell module insulation film in the present aspect includes two embodiments. In the following, each embodiment will be explained separately.

I. First Embodiment

The first embodiment of the solar cell module insulation film in the present aspect includes a sealing material layer, an insulating substrate, and a polyethylene-based resin layer, in this order, wherein the polyethylene-based resin layer is a polyethylene film; and a wetting tension of a surface of the polyethylene-based resin layer that is opposite side to the insulating substrate is 36 dyne/cm or more.

Figure 1:
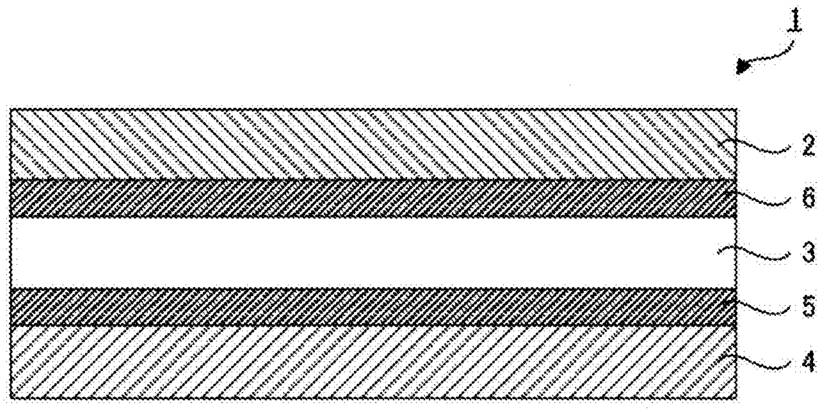
FIG. 1 is a schematic cross-sectional view exemplifying the solar cell module insulation film in the first aspect of the present disclosure.

FIG. 1 is a schematic cross-sectional view showing an example of the solar cell module insulation film of the present embodiment. As shown in FIG. 1, solar cell module insulation film 1 includes sealing material layer 2, insulating substrate 3, and polyethylene-based resin layer 4, in this order. Also, the polyethylene-based resin layer 4 is a polyethylene film, and a surface of the polyethylene-based resin layer 4 that is the opposite side to the insulating substrate 3 has a specified wetting tension.

As shown in FIG. 1, the solar cell module insulation film 1 of the present embodiment may include first adhesive layer 5 between the insulating substrate 3 and the polyethylene-based resin layer 4. Also, the solar cell module insulation film 1 of the present embodiment may include second adhesive layer 6 between the insulating substrate 3 and the sealing material layer 2.

The solar cell module insulation film of the present embodiment is a member disposed between the solar cell and the steel sheet in the solar cell module, and the sealing material layer is disposed in the solar cell side, and the polyethylene-based resin layer is disposed in the steel sheet side. In the present embodiment, the surface of the polyethylene-based resin layer that is opposite side to the insulating substrate has a specified wetting tension, and thus the adhesion to the steel sheet used in the solar cell module is excellent.

Here, conventionally, in the sealing material sheet used in the solar cell module, a silane coupling agent is added for the purpose of improving the adhesion of the solar cell, the frontside protective sheet, and the backside protective sheet. In the case the sealing material sheet contains the silane coupling agent, for example when the sealing material sheet is produced by a roll-to-roll method, the silane coupling agent included in the sealing material sheet may adhere to the roll. Alternatively, the silane coupling agent included in the sealing material sheet may transfer to the other surface of the sealing material sheet, when overlapping the sealing material sheet.

The thinner the thickness of the sealing material sheet, the more the effect of the adhesion or transfer of the silane coupling agent to the adhesion. For this reason, when the sealing material sheet contains the silane coupling agent, it is necessary to increase the thickness of the sealing material sheet.

In contrast, in the present embodiment, as described above, since the wetting tension of the surface of the polyethylene-based resin layer that is opposite side to the insulating substrate is in the specified range, the adhesion to the steel sheet can be improved. For this reason, it is not necessary to include the silane coupling agent for the adhesion improvement, and the thickness of the polyethylene film configuring the polyethylene-based resin layer can be decreased. Also, in the present embodiment, the thickness of the polyethylene film is comparatively thin, as it is called a "film". Thus, the overall thickness of the solar cell module insulation film can be decreased. Therefore, when the solar cell module insulation film of the present embodiment is used in a solar cell module, it is possible to decrease the thickness and the weight of the solar cell module.

Here, for example, when the frontside protective sheet, the sealing material sheet, the solar cell, the sealing material sheet, the insulating substrate, the sealing material sheet, and the steel sheet are respectively prepared, and these members are layered in the order and integrated by a thermal compression to produce the solar cell module, members at the time of layering vary, and the operation of layering by overlapping these members in the specified position is complicated and the number of steps is a lot, and thus the productivity is inferior and the cost is high.

In contrast, in the solar cell module insulation film in the present embodiment, the sealing material layer, the insulating substrate and the polyethylene film are integrated in advance. Thus, when the solar cell module insulation film of the present embodiment is used to produce a solar cell module, for example, the transparent substrate, the sealing material sheet, the solar cell, the solar cell module insulation film, and the steel sheet may be layered in the order and integrated by the thermal compression, which results in reduction of the number of steps and members and improvement of the productivity.

As a method for layering a plurality of films, for example, a dry laminating method has been known. By the dry laminating method, there is a limit of the thickness that can be laminated. Since the thickness of the sealing material sheet is comparatively thick in general, the total thickness of the sealing material sheet, the insulating substrate, and the sealing material sheet is, for example, 1 mm or more. For this reason, it is difficult to layer the sealing material sheet, the insulating substrate, and the sealing material sheet by the dry laminating method.

Meanwhile, in the present embodiment, as described above, since the thickness of the polyethylene film is comparatively thin, it is possible to layer the sealing material layer, the insulating substrate, and the polyethylene film by the dry laminating method. Thus, the sealing material layer, the insulating substrate and the polyethylene film are integrated in advance in the solar cell module insulation film.

Also, in the solar cell module insulation film of the present embodiment, since the insulating substrate is included between the sealing material layer and the polyethylene film, the insulation can be improved, and the occurrence of short circuit defect of the electrode of the solar cell and the steel sheet can be inhibited.

Each configuration of the solar cell module insulation film of the present embodiment will be hereinafter explained.

1. Polyethylene-Based Resin Layer

The polyethylene-based resin layer in the present embodiment is a member that is disposed on a surface of the insulating substrate that is opposite side to the sealing material layer, and is disposed on the outermost surface in the solar cell module insulation film.

Also, the polyethylene-based resin layer is a polyethylene film, and the wetting tension of the surface of the polyethylene-based resin layer that is opposite side to the insulating substrate is the specified value or more.

In the present embodiment, the wetting tension of the surface of the polyethylene-based resin layer that is opposite side to the insulating substrate is, 36 dyne/cm or more, preferably 40 dyne/cm or more, and more preferably 46 dyne/cm or more. When the wetting tension is in the above range, the adhesion to the steel sheet can be improved. Meanwhile, the larger the wetting tension, the more preferable, and there is no particular upper limit of the wetting tension.

Here, the wetting tension of the surface of the polyethylene-based resin layer that is opposite side to the insulating substrate can be measured in accordance with JIS K6768: 1999 (Plastic Film and Sheet Wetting Tension Test Method) The details of the measurement method of the wetting tension are as described in Examples.

Examples of the method for adjusting the wetting tension of the surface of the polyethylene-based resin layer that is opposite side to the insulating substrate to the above range may include, as described later, a method by performing a surface treatment to the surface of the polyethylene-based resin layer that is opposite side to the insulating substrate.

The surface treatment is preferably performed to the polyethylene-based resin layer. When the surface treatment is performed to the surface of the polyethylene-based resin layer that is opposite side to the insulating substrate, as described above, the wetting tension of the surface of the polyethylene-based resin layer that is opposite side to the insulating substrate can be adjusted to the specified range, and the adhesion to the steel sheet can be improved. Meanwhile, when the surface treatment is performed to the surface of the polyethylene-based resin layer that is the insulating substrate side, the adhesion to the first adhesive layer can be improved.

The surface treatment is not particularly limited if it is a surface treatment capable of adjusting the wetting tension of the surface of the polyethylene-based resin layer that is opposite side to the insulating substrate to the specified range, and examples thereof may include a corona treatment, a plasma treatment, an ultraviolet-ray treatment, an electron-ray treatment, and a frame treatment. Among those, the corona treatment is preferable in view of reducing the processing cost and the damage to the polyethylene-based resin layer.

In the present embodiment, the polyethylene-based resin layer is a polyethylene-based resin film. The thickness of the polyethylene film is comparatively thin, as it is called a "film". In specific, the thickness of the polyethylene film is preferably 10 μm or more and 300 μm or less, more preferably 20 μm or more and 200 μm or less, and further preferably 30 μm or more and 100 μm or less. In the present embodiment, as described above, since it is not necessary to include a silane coupling agent in the polyethylene film configuring the polyethylene-based resin layer for improving the adhesion, the thickness of the polyethylene film can be decreased.

Here, the thickness of the polyethylene-based resin layer can be an average value of the thicknesses at arbitrary 10 points obtained by measuring the cross-section of the thickness direction of the solar cell module insulation film observed by an optical microscope.

Also, the thickness of the polyethylene-based resin layer can be obtained by peeling the polyethylene-based resin layer from the solar cell module insulation film to measure the thickness of the polyethylene-based resin layer, and by peeling the polyethylene-based resin layer from the solar cell module insulation film and obtaining the difference between the thickness of the whole solar cell module insulation film and the thickness of the member after peeling off of the polyethylene-based resin layer from the solar cell module insulation film. In this case, the thickness can be measured by, for example, a micrometer and a weighing method. Note that the measurement method for the thickness of the other members can be the same unless otherwise described.

The polyethylene-based resin layer is not particularly limited if it satisfies the above described wetting tension, but it is preferably a non-crosslinking polyethylene-based resin layer.

Here, conventionally, as the sealing material sheet used in a solar cell module, for example, a sealing material sheet containing a crosslinking agent and using an ethylene-vinyl acetate copolymer (EVA) as a base resin, and a crosslinking sealing material sheet such as a sealing material sheet containing a crosslinking agent and using a polyolefin resin as a base resin, have been known. These crosslinking sealing material sheets are uncrosslinked resin films, and will be crosslinked by heating during the production of the solar cell module and heating in other crosslinking steps.

Also, when the crosslinking sealing material sheet contains a silane coupling agent in addition to the crosslinking agent, the crosslinking reaction of the base resin and the graft reaction of the silane coupling agent to the base resin are necessary, so the range of heating conditions during the production of the solar cell module will be narrow. Further, when the crosslinking sealing material sheet contains the silane coupling agent in addition to the crosslinking agent, and when the sealing material sheet, the insulating substrate, and the sealing material sheet are layered by the dry laminating method, after pasting the adhesive agent for dry laminating, the crosslinking agent and the silane coupling agent included in the crosslinking sealing material sheet are volatilized at the time of drying the solvent included in the adhesive agent for dry laminating. For this reason, it is difficult to layer the crosslinking sealing material sheet, the insulating substrate, and the crosslinking sealing material sheet by the dry laminating method.

In contrast, since the crosslinking step is not necessary for the non-crosslinking polyethylene-based resin layer when the solar cell module is produced using the solar cell module insulation film in the present aspect, it is possible to reduce the production cost and the production time. Further, as described above, the non-crosslinking polyethylene-based resin layer does not contain the crosslinking agent, and in the present embodiment, it is not necessary to include the silane coupling agent for improving the adhesion, and thus the range of the heating conditions at the time of producing the solar cell module can be widened. Also, since the non-crosslinking polyethylene-based resin layer does not contain the crosslinking agent, and it is not necessary to include the silane coupling agent in the present embodiment, it is suitable for layering by the dry laminating method.

Also, in general, in the crosslinking polyethylene-based resin layer, a resin with comparatively high melt mass flow rate (MFR) and comparatively low melting point is used. On the occasion of forming a thin layer of the resin composition including such a base resin, when the layer formation speed is fast, it is not cooled in time and there is a high possibility of a phenomenon occurrence that the sealing material sheet will be removed by the rubber roll.

In contrast, in general, in the non-crosslinking polyethylene-based resin layer, a resin with comparatively high melting point is used in consideration of heat resistance. In this case, the density of the resin is also comparatively high, and the melt mass flow rate (MFR) of the resin tends to be comparatively low. Thus, the occurrence of the defect as described above can be inhibited.

The non-crosslinking polyethylene-based resin layer usually does not contain the crosslinking agent. When the polyethylene-based resin layer does not contain the crosslinking agent, it can be said that it is the non-crosslinking polyethylene-based resin layer. In other words, it is preferable that the polyethylene-based resin layer does not contain the crosslinking agent.

The presence or absence of the crosslinking agent in the polyethylene-based resin layer can be analyzed by, for example, an infrared ray spectroscopy (IR) and a gas chromatography mass spectrometry (GC-MS).

Also, a gel content of the non-crosslinking polyethylene-based resin layer is usually 0%. When the gel content of a non-crosslinking polyethylene-based resin layer is 0%, it can be said that it is the non-crosslinking polyethylene-based resin layer. In other words, it is preferable that the gel content of the polyethylene-based resin layer is 0%.

Here, the "gel content (%)" in the present specification refers to a gel content obtained by putting 1.0 g of the sample to a resin mesh, extracting for 24 hours in a xylene at 110° C., and then taking out the resin mesh and weighing thereof after a dry treatment, and conducting a mass comparison of before and after the extraction to measure a mass % of a residual insoluble matter.

Note that the gel content 0% means that the residual insoluble matter is substantially 0. In more specific, "the gel content 0%" refers to a case where the residual insoluble matter is not present at all, and a case where the mass % of the residual insoluble matter measured by a precision balance is less than 0.05 mass %.

Also, the residual insoluble matter does not include components such as a pigment component other than the resin component. When foreign substances other than these resin components are included in the residual insoluble matter by the test, for example, the gel content that should be obtained for the residual insoluble component derived from the resin component other than these foreign substances can be calculated by measuring the content of these foreign substances in the resin composition separately in advance.

In the case where the polyethylene-based resin layer contains a silane modified resin, when the gel content of the polyethylene-based resin layer is 15% or less, it is the non-crosslinking polyethylene-based resin layer. As described later, when the polyethylene-based resin layer contains a silane modified resin, the silane modified resin itself includes a gel, but the gel is different from a gel derived from the crosslinking agent added during the production of the polyethylene-based resin layer. The gel content of the polyethylene-based resin layer when the polyethylene-based resin layer contains the silane modified resin is preferably 2% or more and 10% or less. When the solar cell module is produced using a crosslinking sealing material sheet, the gel content of the sealing material sheet in the solar cell module is usually over 50%.

The polyethylene-based resin layer contains a polyethylene-based resin. In the present aspect, the polyethylene-based resin refers to a homopolymer of ethylene, or a copolymer mainly composed of ethylene. Here, in the case of the copolymer mainly composed of ethylene, $\alpha$-olefin is used as the other component, and as the $\alpha$-olefin, for example, one kind or more selected from propylene, 1-butene, isobutylene, 1-pentene, 2-methyl-1-butene, 3-methyl-1-butene, 1-hexene, 1-heptene, 1-octene, 1-nonene, and 1-decene, can be used.

The polyethylene-based resin is not particularly limited if it is capable of obtaining the polyethylene-based resin layer that satisfies the above described wetting tension, but above all, from the above described reasons, the non-crosslinking polyethylene-based resin is preferable. Examples of the polyethylene-based resin may include a high-density polyethylene (HDPE), a low-density polyethylene (LDPE), a linear low-density polyethylene (LLDPE), a metallocene-based linear low-density polyethylene (M-LLDPE), and a very low-density polyethylene (VLDPE). The polyethylene-based resin may be used in one kind solely, and two kinds or more thereof may be used in combination.

Among these, for excellent flexibility and workability, the low-density polyethylene (LDPE), the linear low-density polyethylene (LLDPE), the metallocene-based linear low-density polyethylene (M-LLDPE), and the very low-density polyethylene (VLDPE) are preferable. In particular, for excellent flexibility, workability, and strength, the linear low-density polyethylene (LLDPE) and the metallocene-based linear low-density polyethylene (M-LLDPE) are preferable. Furthermore, the metallocene-based linear low-density polyethylene (M-LLDPE) is preferable. The metallocene-based low-density polyethylene (M-LLDPE) is synthesized by a metallocene catalyst that is a single-site catalyst. Such a polyethylene does not include many branches in side chains, and the distribution of copolymer is uniform. For this reason, the molecular weight distribution is narrow, and it is possible to decrease the density as described later, and flexibility can be imparted to the polyethylene-based resin layer. Imparting the flexibility to the polyethylene-based resin layer results in the improvement of adhesion of the polyethylene-based resin layer and the steel sheet. Also, the metallocene-based linear low-density polyethylene (M-LLDPE) is excellent in heat resistance.

The density of the polyethylene-based resin is not particularly limited, and for example, the lower limit value is preferably 0.870 g/cm$^3$ or more, and above all, preferably 0.875 g/cm$^3$ or more, and particularly preferably 0.880 g/cm$^3$ or more. Meanwhile, the upper limit value is preferably 0.970 g/cm$^3$ or less, and above all, preferably 0.950 g/cm$^3$ or less, and particularly preferably 0.930 g/cm$^3$ or less. When the density of the polyethylene-based resin is in the above range, the polyethylene-based resin layer can be excellent in flexibility and workability, and can have excellent adhesion to the steel sheet.

Here, the density of the polyethylene-based resin can be measured by, for example, a pycnometer method in accordance with JIS K7112:1999.

The melting point of the polyethylene-based resin is not particularly limited, and for example, as the lower limit value, it is preferably 55° C. or more, and above all, preferably 80° C. or more, and particularly preferably 90° C. or more. Meanwhile, the upper limit value is preferably 130° C. or less, more preferably 120° C. or less, and further preferably 115° C. or less. When the melting point of the polyethylene-based resin is in the above range, the adhesion to the steel sheet can be improved. Meanwhile, when the melting point of the polyethylene-based resin is too high, it is necessary to raise the heating temperature during the production of the solar cell module by the thermal compression for integration using the solar cell module insulation film, and thus there are risks that the production cost may increase and the insulating substrate may deteriorate. Also, when the melting point of the polyethylene-based resin is too low, the polyethylene-based resin layer may melt in a use environment of the solar cell module.

Here, in the present specification, the melting point of a resin can be measured by a differential scanning calorimetry (DSC) in accordance with JIS K7121:2012 (Transfer temperature measurement method of plastic). On that occasion, when two or more melting point peaks are present, higher temperature can be the melting point.

A melt mass flow rate (MFR) of the polyethylene-based resin at 190° C. is, for example, as the lower limit value, 0.5 g/10 minutes or more is preferable, 1 g/10 minutes or more is more preferable, and 1.5 g/10 minutes or more is further preferable. Meanwhile, the upper limit value is preferably 20 g/10 minutes or less, more preferably 10 g/10 minutes or less, and further preferably 8 g/10 minutes or less. When the MFR of the polyethylene-based resin is in the above range, the adhesion to the steel sheet can be improved.

Here, the melt mass flow rate (MFR) of the polyethylene-based resin can be measured by A method in accordance with JIS K7210-1-1999. The measurement conditions are, temperature: 190° C. and load: 2.16 kg.

The melt mass flow rate (MFR) of the polyethylene-based resin layer at 190° C. is, for example, as the lower limit value, preferably 0.5 g/10 minutes or more, more preferably 1 g/10 minutes or more, and further preferably 1.5 g/10 minutes or more. Meanwhile, the upper limit value is preferably 20 g/10 minutes or less, more preferably 10 g/10 minutes or less, and further preferably 8 g/10 minutes or less. When the MFR of the polyethylene-based resin layer is in the above rage, the adhesion to the steel sheet can be improved. Note that the MFR of the polyethylene-based resin layer refers to the MFR of the polyethylene-based resin composition configuring the polyethylene-based resin layer.

The measurement method of the MFR of the polyethylene-based resin layer is the same as the measurement method of the MFR of the polyethylene-based resin described above.

The polyethylene-based resin layer may, as the resin component, contain just the polyethylene-based resin, and may further contain resins other than the polyethylene-based resin in addition to the polyethylene-based resin. In the latter case, the polyethylene-based resin layer preferably contains the polyethylene-based resin as the main component. The polyethylene-based resin layer containing the polyethylene-based resin as the main component means that the ratio of the polyethylene-based resin is the most among all the resin components.

The proportion of the polyethylene-based resin with respect to all the resin components in the polyethylene-based resin layer is, for example, 50 mass % or more, may be 60 mass % or more, and may be 70 mass % or more. Also, the proportion of the polyethylene-based resin is, for example, 99 mass % or less, may be 95 mass % or less, and may be 90 mass % or less. The proportion of the polyethylene-based resin may be 100 mass %.

The polyethylene-based resin layer may contain, for example, an additive such as a UV absorbent, a light stabilizer, an antioxidant, and an anti-blocking agent, as required.

Here, the proportion of each resin component included in each layer of the solar cell module insulation film in the present aspect can be analyzed from a peak ratio and the like detected by a nuclear magnetic resonance (NMR).

There are no particular limitations on the method for forming the polyethylene-based resin layer, and examples thereof may include an inflation method and a T-die method.

2. Insulating Substrate

The insulating substrate in the present embodiment is a member disposed between the sealing material layer and the polyethylene-based resin layer, and includes insulating properties.

As the insulating substrate, for example, a resin substrate including insulating properties can be used. Examples of a resin configuring the insulating substrate may include a polyethylene terephthalate, a polyethylene naphthalate, a polybutylene terephthalate, a polyimide, a polyamide, a polycarbonate, and a modified polyphenylene ether. These resins may be used in one kind solely, and two kinds or more thereof may be used in combination. Among these, the insulating substrate preferably contains the polyethylene terephthalate. The reason therefor is that excellent insulating properties, size stability and heat resistance can be imparted to the insulating substrate.

The insulating substrate may contain a coloring agent. Examples of the coloring agent may include a white pigment and a dark color pigment. Among them, the white pigment is preferable.

When the insulating substrate contains the white pigment, the insulating substrate can reflect visible light and near-infrared rays that contribute to power generation by the solar cell. Thereby, when the solar cell module insulation film in the present aspect is used in a solar cell module, the insulating substrate can reflect the visible light and near-infrared rays and incident again to the solar cell, and the power generation efficiency of the solar cell module can be improved.

Also, when the insulating substrate contains the white pigment, the insulating substrate can reflect an infrared ray that does not contribute to the power generation of the solar cell. Thereby, when the solar cell module insulation film in the present aspect is used in a solar cell module, the insulating substrate can reflect the infrared ray not absorbing thereof, and the temperature rise of the solar cell module can be suppressed. As a result, the degrade in power generation efficiency due to the temperature rise of the solar cell module can be inhibited.

As the white pigment, for example, a titanium oxide, a calcium carbonate, a barium sulfate, and a silicone oxide can be used. Among them, the titanium oxide is preferable. Also, the average particle size of the titanium oxide is, for example, preferably 0.2 μm or more and 1.5 μm or less. Such an insulating substrate including the white pigment can reflect the visible light and the near-infrared ray that contribute to the power generation of the solar cell well, and thus the power generation efficiency of the solar cell module can be improved when the solar cell module insulation film in the present aspect is used in the solar cell module.

Here, the average particle size of the white pigment can be obtained by, for example, observation with a transmission electron microscope (TEM). In specific, after taking a picture of a primary particle size of the white pigment by a transmission electron microscope from JOEL., Ltd. (JEM-1230), the image is subjected to a statistical processing with an image analysis type particle distribution measurement software from MOUNTECH Co., Ltd. (MAC-View Ver. 3), and the value obtained by the calculation can be applied. For the calculation of the average particle size, equivalent circle diameter based on volume is applied. All the average particle sizes of each resin and powder materials of inorganic filler can be measured by the above method.

The lower limit value of the content of the white pigment in the insulating substrate is preferably 2 mass % or more, more preferably 4 mass % or more, and further preferably 5 mass % or more. Meanwhile, the upper limit value is preferably 20 mass % or less, more preferably 15 mass % or less, and further preferably 10 mass % or less. When the content of the white pigment is too little, there is a risk that the function of reflecting the visible light, the near-infrared ray and the infrared ray may be insufficient. Also, when the content of the white pigment is too much, the effect of improving the reflection rate of the visible light, the near-infrared ray and the infrared ray may not be obtained by further addition. Also, when the content of the white pigment is too much, there are risks that the layer formation may be degraded, and the smoothness of the insulating substrate may be degraded due to bleed out and the like.

Here, for example, in the solar cell module, when the solar cell module is observed from the light receiving surface side, if the colors are different in the region where the solar cell is disposed from the region where the solar cell is not disposed, the appearance may be impaired. In contrast, in the case where the insulating substrate contains the dark color pigment, when the solar cell module insulation film in the present aspect is used in the solar cell module, the colors of the region where the solar cell is disposed and the region where the solar cell is not disposed can be matched. Thereby, the appearance and the design of the solar cell can be improved.

Also, regarding the dark color pigment, the "dark color" in the present specification refers to a color of which a* value and b* value in a CIE chromatic coordinate with a standard light source of D65 and view angle of 2° measured in the reflection light in accordance with JIS Z8722-2009 using a standard white plate underneath as a ground are in the range of $-4.0 \leq a^* \leq 5.0$ and $-10.0 \leq b^* \leq 1.0$.

The dark color pigment is not particularly limited if the pigment exhibits a dark color appearance, and examples thereof may include a carbon black; a perylene-based pigment; and a mixture dark color pigment that is a mixture of a brown color-based pigment and a blue color-based pigment.

Examples of the brown color-based pigment included in the mixture pigment may include a benzimidazolone-based pigment, 4-[(2,5-dichlorophenyl)azo]-3-hydroxy-N-(2,5-dimethoxypheny 1)-2-naphthalenecarboxyamide, 1-[(4-nitrophenyl)azo]-2-naphthalenol, bis[3-hydroxy-4-(phenylazo)-2-naphthalencarboxylate]cuprate, N,N'-bis(2,4-dinitrophenyl)-3,3'-dimethoxy-1,1'-biphenyl-4,4'-diamine, 3,4,9,10-perylenetetracarboxylic acid diimide, Δ2,2' (1H, 1'H)-binaphtho[2,1-b]thiophene-1,1'-dione, and N,N'-(10, 15,16,17-tetrahydro-5,10,15,17-tetraoxo-5H-dinapht ho[2, 3-a:2'3'-i]carbazole-4,9-diyl)bis(benzamide). These brown color pigments may be used in one kind solely, and two kinds or more thereof may be used in combination.

As the brown color-based pigment, among those, the benzimidazolone-based pigment is preferable. The benzimidazolone-based pigment is a pigment having a benzimidazolone skeleton represented by the below general formula. Specific examples thereof may include C.I.PigmentYellow120, C.I.PigmentYellow151, C.I.PigmentYellow154, C.I.PigmentYellow175, C.I.PigmentYellow180, C.I.PigmentYellow181, C.I.PigmentYellow194, C.I.PigmentRed175, C.I.PigmentRed176, C.I.PigmentRed185, C.I.PigmentRed208, C.I.PigmentViolet32, C.I.PigmentOrange36, C.I.PigmentOrange62, C.I.PigmentOrange72, and C.I.PigmentBrown25, but it is not limited thereto. Among those, from the view point of the color gamut, C.I.PigmentBrown25 is preferable.

[Chemical 1]

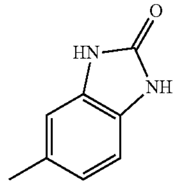

Examples of the blue color-based pigment included in the mixture dark color pigment may include a phthalocyanine-based pigment. The phthalocyanine-based pigment is a pigment having a phthalocyanine skeleton, and the concept including phthalocyanine coordinated with various metals. Specific examples thereof may include C.I.PigmentGreen7, C.I.PigmentGreen36, C.I.PigmentGreen37, C.I.PigmentBlue16, C.I.PigmentBlue75, and C.I.PigmentBlue15.

The mixture ratio of the brown color-based pigment and the blue color-based pigment in the mixture dark color pigment is appropriately adjusted in accordance with the color of the solar cell. The mixture ratio of the brown color-based pigment and the blue color-based pigment may be, for example, in the range of 45:55 to 70:30.

The content of the dark color pigment in the insulating substrate is, for example, as the lower limit value, preferably 10 mass % or more, more preferably 15 mass % or more, and further preferably 20 mass % or more. Meanwhile, the upper limit value is preferably 50 mass % or less, more preferably 35 mass % or less, and further preferably 20 mass % or more and 30 mass % or less. When the content of the dark color pigment is in the above range, high insulation and design can be imparted to the insulating substrate.

The insulating substrate can include additional additives other than the above as required. Examples of the additives may include a UV-absorbent, a light stabilizer, an antioxidant, an anti-static agent, and a flame retardant agent.

The thickness of the insulating substrate is appropriately set in accordance with the required system voltage for the solar cell module and the like, but for example, the lower limit value is preferably 25 μm or more, more preferably 40 μm or more, and further preferably 45 μm or more. Meanwhile, the upper limit value is preferably 350 μm or less, more preferably 200 μm or less, and further preferably 160 μm or less. When the thickness of the insulating substrate is too thin, there is a possibility that the desired properties such as insulation and design may not be obtained, and there is a possibility that the handling suitability of the solar cell module insulation film may be deteriorated. Also, when the thickness of the insulating substrate is too thick, it may be difficult to reduce the thickness and weight of the solar cell module.

3. Sealing Material Layer

The sealing material layer in the present embodiment is a member that is disposed on a surface of the insulating substrate that is opposite side to the polyethylene-based resin layer, and is disposed on the outermost surface in the solar cell module insulation film.

The sealing material layer is not particularly limited if it can be used as a sealing material of the solar cell module, and examples thereof may include a sealing material layer mainly composed of polyolefin, ionomer, and polyvinyl butyral (PVB). Examples of the polyolefin may include a polyethylene-based resin, an ethylene vinyl-acetate copolymer (EVA) and a polyolefin elastomer (POE).

Also, the sealing material layer may contain a coloring agent. Examples of the coloring agent may include a dark color pigment. The dark color pigment may be the same as the dark color pigment used for the insulating substrate.

Above all, the sealing material layer is preferably a non-crosslinking polyolefin layer. The non-crosslinking polyolefin layer does not require a crosslinking step when a solar cell module is produced using the solar cell module insulation film in the present aspect, and thus it is possible to reduce the production cost and the production time.

The non-crosslinking polyolefin layer usually does not contain a crosslinking agent. When the polyolefin layer does not contain the crosslinking agent, it can be said it is the non-crosslinking polyolefin layer. In other words, it is preferable that the polyolefin layer does not contain the crosslinking agent.

Note that the analysis method for the presence or absence of the crosslinking agent in the polyolefin layer is as described above.

Also, the gel content of the non-crosslinking polyolefin layer is usually 0%. When the gel content of the polyolefin layer is 0%, it can be said it is the non-crosslinking polyolefin layer. In other words, it is preferable that the gel content of the polyolefin layer is 0%.

As described later, when the polyolefin layer contains a silane modified resin, it is the non-crosslinking polyolefin layer even if the gel content of the polyolefin layer is 15% or less for example, similarly to the polyethylene-based resin layer described above.

The definition of the gel content and the measurement method of the gel content are as those described above.

(1) Polyolefin Layer

The polyolefin layer in the present embodiment is a member configuring the sealing material layer, and is a member disposed on the outermost surface that is a surface of the sealing material layer opposed to the insulating substrate side.

(a) Materials of Polyolefin Layer (i) Polyolefin-Based Resin

The polyolefin layer contains a polyolefin-based resin. The polyolefin-based resin is not particularly limited if it can be used as the sealing material of the solar cell module, but above all, from the reasons described above, the non-crosslinking polyolefin-based resin is preferable. Examples of the non-crosslinking polyolefin-based resin may include a polyethylene-based resin, a polypropylene-based resin, a propylene—ethylene copolymer resin, and an ethylene—αtolefin copolymer resin. Among those, the polyethylene-based resin is preferable. In other words, the polyolefin layer is preferably a polyethylene layer. The reason therefor is that the polyethylene-based resin is excellent in sealing properties.

The polyethylene-based resin is not particularly limited if it can be used as the sealing material of the solar cell module, but above all, from the reasons described above, the non-crosslinking polyethylene-based resin is preferable. Examples of the polyethylene-based resin may include a high-density polyethylene (HDPE), a low-density polyethylene (LDPE), a linear low-density polyethylene (LLDPE), a metallocene-based linear low-density polyethylene (M-LLDPE), and a very low-density polyethylene (VLDPE). The polyethylene-based resin may be used in one kind solely, and two kinds or more thereof may be used in combination.

Among these, for excellent flexibility and workability, the low-density polyethylene (LDPE), the linear low-density polyethylene (LLDPE), the metallocene-based linear low-density polyethylene (M-LLDPE), and the very low-density polyethylene (VLDPE) are preferable. In particular, for excellent flexibility, workability, and strength, the linear low-density polyethylene (LLDPE) and the metallocene-based linear low-density polyethylene (M-LLDPE) are preferable. Furthermore, the metallocene-based linear low-density polyethylene (M-LLDPE) is preferable. As described above, the molecular weight distribution of the metallocene-based linear low-density polyethylene (M-LLDPE) is narrow, and it is excellent in adhesion and heat resistance.

The density of the polyethylene-based resin is not particularly limited, and for example, the lower limit value is preferably 0.870 g/cm$^3$ or more, more preferably 0.875 g/cm$^3$ or more, and further preferably 0.880 g/cm$^3$ or more. Meanwhile, the upper limit value is preferably 0.970 g/cm$^3$ or less, more preferably 0.950 g/cm$^3$ or less, and further preferably 0.930 g/cm$^3$ or less. When the density of the polyethylene-based resin is in the above range, the polyethylene layer can be excellent in flexibility and workability, and excellent in adhesion to the solar cell.

Note that the measurement method of the density of the polyethylene-based resin is as described above.

The melting point of the polyethylene-based resin is not particularly limited, and for example, the lower limit value is preferably 55° C. or more, more preferably 80° C. or more, and further preferably 90° C. or more. Meanwhile, the upper limit value is preferably 130° C. or less, more preferably 120° C. or less, and further preferably 115° C. or less. When the melting point of the polyethylene-based resin is too high, it is necessary to raise the heating temperature during the production of the solar cell module by the thermal compression for integration using the solar cell module insulation film in the present aspect, and there are risks that the production cost may increase and the insulating substrate may deteriorate. Also, when the melting point of the polyethylene-based resin is too high, embedding of the wiring and the like in the sealing material layer may be insufficient, and there is a possibility that the insulation cannot be ensured. Meanwhile, when the melting point of the polyethylene-based resin is too low, there is a risk that the polyethylene layer may melt in a use environment of the solar cell module.

The polyolefin layer may contain just the polyolefin-based resin as the resin component, and may further contain additional resin other than the polyolefin-based resin in addition to the polyolefin-based resin. In the latter case, the polyolefin layer preferably contains the polyolefin-based resin as a main component. Note that the polyolefin layer contains the polyolefin-based resin as the main component means that the ratio of the polyolefin-based resin is the most among all the resin components.

The proportion of the polyolefin-based resin with respect to all the resin components in the polyolefin layer is, for example, 50 mass % or more, may be 60 mass % or more, and may be 70 mass % or more. Also, the proportion of the polyolefin-based resin is, for example, 99 mass % or less, may be 95 mass % or less, and may be 90 mass % or less. The proportion of the polyolefin-based resin may be 100 mass %.

(ii) Silane Modified Resin

In the present embodiment, the polyolefin layer preferably contains a silane modified resin. When the polyolefin layer contains the silane modified resin, properties such as adhesion to the solar cell, strength and durability can be improved.

Also, in the present embodiment, when the polyolefin layer contains the silane modified resin, it is not necessary to include a silane coupling agent for improving adhesion, and thus the thickness of the polyolefin layer can be decreased. Thereby, the overall thickness of the solar cell module insulation film can be decreased. Thus, when the solar cell module insulation film of the present embodiment is used in a solar cell module, the thickness and the weight of the solar cell module can be reduced.

Also, in the present embodiment, when the polyolefin layer is the non-crosslinking polyolefin layer and contains the silane modified resin, it does not contain a crosslinking agent and it is not necessary to include the silane coupling agent for improving adhesion, and thus the range of the heating conditions at the time of producing the solar cell module can be widened. Also, when the polyolefin layer is the non-crosslinking polyolefin layer and contains the silane modified resin, it does not contain the crosslinking agent and since it is not necessary to include the silane coupling agent for improving adhesion, it is suitable for layering by the dry laminating method.

Examples of the silane modified resin may include a silane modified polyolefin resin. The silane modified polyolefin resin is a copolymer of α-olefin and an ethylene unsaturated silane compound. As the copolymer, for example, any of a random copolymer, an alternating copolymer, a block copolymer, and a graft copolymer may be used. Among them, the copolymer is preferably the graft copolymer, and preferably a graft copolymer with polyolefin as a main chain and ethylene unsaturated silane compound polymerized as a side chain. Such a graft copolymer has a higher degree of freedom for the silanol groups that contribute to adhesion, and thus the adhesion to the solar cell can be further improved.

Examples of the α-olefin that constitutes the silane modified polyolefin resin may include ethylene, propylene, 1-butene, isobutylene, 1-pentene, 2-methyl-1-butene, 3-methyl-1-butene, 1-hexene, 1-heptene, 1-octene, 1-nonene, and 1-decene. The α-olefin may be used in one kind solely, and two kinds or more thereof may be used in combination. Among those, polyethylene is preferable. In other words, the silane modified polyolefin resin is preferably a silane modified polyethylene resin. The reason therefor is that the silane modified polyethylene resin has good compatibility with the polyethylene-based resin included in the polyolefin layer.

Also, the silane modified polyethylene resin is preferably a resin made by graft polymerizing linear low-density polyethylene (LLDPE) as the main chain and an ethylene unsaturated silane compound as the side chain.

Examples of the ethylene unsaturated silane compound may include vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenziloxysilane, vinyltrimethylenedioxysilane, vinyltriethylenedioxysilane, vinylpropionyloxysilane, vinyltriacetoxysilane, and vinyltricarboxysilane. The ethylene unsaturated silane compounds may be used in one kind solely, and two kinds or more thereof may be used in combination.

The silane modified polyolefin resin can be obtained by, for example, a production method described in JP-A No. 2003-46105.

The silane modified resin may be used in one kind solely, and two kinds or more thereof may be used in combination.

The content of the silane modified resin in the polyolefin layer is not particularly limited, and for example, the lower limit value is preferably 0.1 mass % or more, more preferably 1 mass % or more, and further preferably 5 mass % or more. Meanwhile, the upper limit value is preferably 60 mass % or less, more preferably 50 mass % or less, and further preferably 45 mass % or less. When the content of the silane modified resin is too little, effect of the adhesion improvement by the silane modified resin may not be sufficiently obtained. Also, when the content of the silane modified resin is too much, tensile elongation and heat weldability tend to be poor. Lower limit value Also, the content of the silicon atoms in the polyolefin layer is, for example, as the lower limit value, preferably 0.0001 mass % or more, more preferably 0.001 mass % or more, and further preferably 0.01 mass % or more. Meanwhile, the upper limit value is preferably 15.0 mass % or less, more preferably 1.0 mass % or less, and further preferably 0.5 mass % or less. When the content of the silicon atoms in the polyolefin layer is in the above range, the silane modified resin can be included in the polyolefin layer in the specified amount, and thus the adhesion to the solar cell can be further improved.

Here, the content of the silicon atoms in the polyolefin layer can be determined by Inductively Coupled Plasma Atomic Emission Spectroscopy; ICP-AES.

(iii) Light Stabilizer

Also, the polyolefin layer may contain a light stabilizer. When the polyolefin layer contains the light stabilizer, the polyolefin layer can be prevented from the ultraviolet ray deterioration. As the light stabilizer, for example, usage of a hindered amine-based light stabilizer (HALS) is preferable.

The hindered amine-based light stabilizer is not particularly limited if it exhibits a light stabilizing effect, but for example, a high molecular weight type light stabilizer can be suitably used. As the high molecular weight type light stabilizer, for example, a copolymer of ethylene and a cyclic amino vinyl compound (hindered amine acrylate) with molecular weight of 30000 or more can be suitably used.

Specific examples of the high molecular weight type light stabilizer may include a copolymer of ethylene and a cyclic amino vinyl compound (hindered amine acrylate) represented by the below chemical formula (1).

[Chemical 2]

Chemical formula (1)

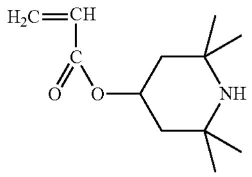

Specific examples of the high molecular weight type hindered amine-based light stabilizer may include "XJ-100H (product name)" (molecular weight: 35000) from Japan Polyethylene Corporation.

Also, additional examples of the hindered amine-based light stabilizer may include a NOR type hindered amine-based light stabilizer.

An example of the NOR type hindered amine-based light stabilizer is a compound including a group represented by a general formula (1).

[Chemical 3]

General formula (1)

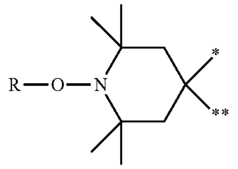

In the general formula (1), R is a substituted or unsubstituted carbohydrate group or acyl group. Examples of the R may include an alkyl group, an alkenyl group, an alkylene group, a cycloalkyl group, a bicycloalkyl group, a phenyl group, a naphthyl group, a phenylalkyl group, an alkyl group substituted phenyl group, a hydroxyl group substituted alkyl group, an acyl group, an alkoxy substituted alkyl group, and a thioalkoxy group substituted alkyl group. Note that * and ** in the general formula (1) show states capable of binding to another element.

Additional examples of the NOR type hindered amine-based light stabilizer may include a compound represented by a general formula (2) or a general formula (3).

[Chemical 4]

General formula (2)

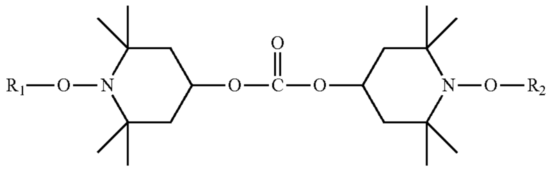

General formula (3)

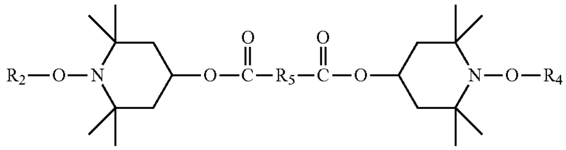

In the general formula (2), $R_1$ and $R_2$ is each independently a substituted or unsubstituted carbohydrate group or acyl group, similarly to the R in the above described general formula (1). Above all, the $R_1$ and the $R_2$ is preferably each independently an alkyl group with 4 to 20 carbon atoms.

In the general formula (3), $R_3$ and $R_4$ is each independently a substituted or unsubstituted carbohydrate group or acyl group, similarly to the R in the above described general formula (1). Above all, the $R_3$ and the $R_4$ is preferably each independently an alkyl group with 4 to 20 carbon atoms. Also, $R_5$ is an alkylene group with 1 to 8 carbon atoms.

Specific examples of the NOR type hindered amine-based light stabilizer may include "ADEKA STAB LA-81 (product name)" from ADEKA CORPORATION, "Tinuvin® PA123 (product name)" (decanedioic acid, bis(2,2,6,6-tetramethyl-1-(octyloxy)-4-piperidinyl)ester) from BASF, and "Tinuvin® XT850FF (product name)" from BASF.

Also, additional example of the hindered amine-based light stabilizer is preferably the one including a high molecular weight type hindered amine-based light stabilizer with molecular weight of 1000 or more, and a low molecular weight type hindered amine-based light stabilizer with molecular weight of less than 1000. Above all, the high molecular weight type hindered amine-based light stabilizer is preferably a $NCH_3$ type hindered amine-based light stabilizer. Also, the low molecular weight type hindered amine-based light stabilizer is preferably the NOR type hindered amine-based light stabilizer. The NOR hindered amine-based light stabilizer is faster in complementing radicals compared to a NH type and the $NCH_3$ type hindered amine-based light stabilizer. Further, the NOR type low molecular type hindered amine-based light stabilizer, which moved to the surface faster than the high molecular weight type hindered amine-based light stabilizer, complements radicals in shorter term compared to the NH type and the $NCH_3$ type hindered amine-based light stabilizer, and thus it is preferable in a point of inhibiting the deterioration of the sealing material layer. When light is irradiated for a long period of time to the NOR type low molecular weight type hindered amine-based light stabilizer that exhibits light resistance in a short term, the function of complementing radicals may be degraded, but when used in combination with the $NCH_3$ type high molecular weight type hindered amine-based light stabilizer that exhibits light resistance in a long term, it is possible to inhibit the deterioration of the sealing material layer for a long period of time.

Specific examples of the high molecular weight type hindered amine-based light stabilizer may include N,N',4, 7-tetrakis{4,6-bis[N-butyl-N-(1,2,2,6,6-pentamethyl-4-piperidyl)amino-1,3,5-triazine-2-yl}-4,7-diazadecane-1,10-diamine ("Chimassorb119 (product name)" from BASF), 1,2,3,4-Butanetetracarboxylic acid, tetramethyl ester, reaction products with 1,2,2,6,6-pentamethyl-4-piperidinol and β,β,β',β'-tetramethyl-2,4,8,10-tetraoxaspiro[5.5]undecane-3,9-diethanol ("LA-63P (product name)" from ADEKA CORPORATION), and a polymer of N,N'-bis(2,2,6,6-tetramethyl-4-piperidyl-1,6-hexandiamine and morpholine-2,4,6-trichloro-1,3,5-triazine ("CyasorbUV-3529 (product name)" from Cytec).

Specific examples of the low molecular weight type hindered amine-based light stabilizer may include Bis(1-octyloxy-2,2,6,6-tetramethyl-4-piperidyl)sebacate ("Tinuvin® PA 123 (product name)" from BASF), Bis(1-undecanoxy-2,2,6,6-tetramethylpiperidin-4-yl)carbonate ("LA-81 (product name)" from ADEKA CORPORATION), and 1-(2-Hydroxy-1,1-dimethyl-ethoxy)-2,2,6,6-tetramethyl-4-pip eridinyl octadecanoate.

Specific examples of the hindered amine-based light stabilizer including the high molecular weight type hindered amine-based light stabilizer and the low molecular weight type hindered amine-based light stabilizer may include "Tinuvin®XT850FF (product name)" from BASF.

The content of the light stabilizer in the polyolefin layer is, for example, as the lower limit value, it is preferably 0.2 mass % or more, and more preferably 0.5 mass % or more. Meanwhile, as the upper limit value, it is preferably 5 mass % or less, and more preferably 3 mass % or less. When the content of the light stabilizer is in the above range, the ultraviolet ray resistance of the polyolefin layer can be improved. Meanwhile, when the content of the light stabilizer is too much, there is a possibility that the transparency of the polyolefin layer may be degraded due to bleed-out of the light stabilizer, and when the sealing material layer further includes a polypropylene layer as described later, there is a possibility that the adhesion between the polyolefin layer and the polypropylene layer may be degraded.

(iv) Other Additives

The polyolefin layer may contain additional additive other than the above as required.

(b) Configuration of Polyolefin Layer

The thickness of the polyolefin layer is, from the viewpoint of sealing properties and the like, for example, as the lower limit value, it is preferably 10 μm or more, more preferably 20 μm or more, and further preferably 30 μm or more. Meanwhile, as the upper limit value, it is preferably 300 μm or less, more preferably 200 μm or less, and further preferably 100 μm or less. In the present aspect, as described above, when the polyolefin layer contains the silane modified resin, since it is not necessary to include the silane coupling agent for improving adhesion, the thickness of the polyolefin layer can be decreased. Meanwhile, when the polyolefin layer is too thick, it may be difficult to reduce the thickness and the weight of the solar cell module.

(2) Polypropylene Layer

Figure 2:
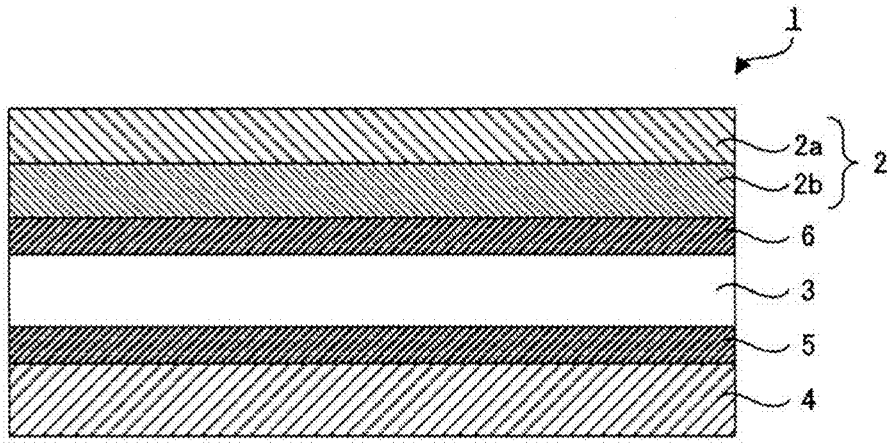
FIG. 2 is a schematic cross-sectional view exemplifying the solar cell module insulation film in the first aspect of the present disclosure.

In the present embodiment, the sealing material layer preferably includes a polypropylene layer in the insulating substrate side with respect to the polyolefin layer. For example, in FIG. 2, sealing material layer 2 includes polypropylene layer 2*b* in insulating substrate 3 side with respect to polyolefin layer 2*a*. When the sealing material layer includes the polypropylene layer, the sealing material can be rigid and usable as a sealing material film. Thus, even when the thickness of the polyolefin layer is thin, inclusion of the polypropylene layer in the sealing material layer facilitates handling of the sealing material layer. Further, the size stability of the solar cell module insulation film can be improved.

(a) Materials of Polypropylene Layer (i) Polypropylene Resin

The polypropylene layer contains a polypropylene resin. The polypropylene resin may be, for example, a homo polypropylene resin that is a propylene homopolymer, may be a random polypropylene resin that is a random copolymer of polypropylene and α-olefin, and may be a block polypropylene resin that is a block copolymer. The polypropylene layer may include the above described polypropylene resins in one kind alone, or two kinds or more thereof. Above all, the polypropylene resin is preferably the homo polypropylene resin. Since the rigidity of the homo polypropylene resin is high, even when the thickness of the polyolefin layer is thin, the handing of the sealing material layer can be improved. Further, the size stability of the solar cell module insulation film can be improved.

The melting point of the polypropylene resin is not particularly limited, and for example, as the lower limit value, it is preferably 90° C. or more, more preferably 110° C. or more, and further preferably 120° C. or more. Meanwhile, as the upper limit value, it is preferably 180° C. or less. The melting point of the polypropylene resin is preferably comparatively high. Meanwhile, when the melting point of the polypropylene resin is too high, layer formation may be poor, and there is a possibility that the extrusion molding may be difficult.

Also, the polypropylene layer may contain, as the resin component, only the polypropylene resin, and may contain additional resin as long as the polypropylene resin is the main component. Here, as long as the polypropylene resin is the main component means that the ratio of the polypropylene resin is the most among all the resin components.

The proportion of the polypropylene resin with respect to all the resin components in the polypropylene layer is, for example, 50 mass % or more, may be 60 mass % or more, may be 65 mass % or more, and may be 70 mass % or more. Also, the proportion of the polypropylene resin is 100 mass % or less, may be 90 mass % or less, may be 80 mass % or less, and may be 75 mass % or less.

Also, when the polypropylene resin is the homo polypropylene resin, the proportion of the homo polypropylene resin with respect to all the resin components in the polypropylene layer is, for example, 50 mass % or more, may be 60 mass % or more, may be 65 mass % or more, and may be 70 mass % or more. Also, the proportion of the polypropylene resin is 100 mass % or less, may be 90 mass % or less, may be 80 mass % or less, and may be 75 mass % or less. When the proportion of the homo polypropylene resin is too little, there is a possibility that the desired rigidity may not be obtained. Meanwhile, since the homo polypropylene resin is poor in transparency compared to resins such as the random polypropylene resin, when the proportion of the homo polypropylene resin is too much, there is a possibility that the transparency of the sealing material layer may be degraded.

(ii) Adhesion Improving Agent

In the present aspect, the polypropylene layer preferably contains an adhesion improving agent for improving adhesion to the polyethylene layer. Examples of the adhesion improving agent may include a polyethylene-based elastomer and a polyethylene-based plastomer. In the present aspect, inclusion of the polyethylene-based elastomer or the polyethylene-based plastomer in the polypropylene layer not only improves the adhesion to the polyethylene layer, but also improves the durability of the sealing material layer.

Examples of the polyethylene-based elastomer and the polyethylene-based plastomer may include a copolymer of ethylene and α-olefin other than ethylene (it may be hereinafter referred to as ethylene-α-olefin copolymer).

There are no particular limitations on the polyethylene configuring the ethylene-α-olefin copolymer, but it is preferably a low-density polyethylene. Also, as the low-density polyethylene, a low-density polyethylene having density of 0.870 g/cm$^3$ or more and 0.910 g/cm$^3$ or less is preferable. The density of polyethylene can be measured by, for example, a method in accordance with JIS 6922-2:2010.

Examples of the α-olefin configuring the ethylene-α-olefin copolymer may include an α-olefin with 3 to 20 carbon atoms. Specific examples thereof may include propylene, 1-butene, 4-methyl-1-pentene, 3-methyl-1-butene, 1-pentene, 1-hexene, 1-heptene, 1-octene, 1-nonene, 1-decene, 1-undecene, and 1-dodecene. One kind or two kinds or more of these may be used.

As the ethylene-α-olefin copolymer, for example, a commercial product may be used. Examples of the commercial product may include "TAFMER™ DF-710 (product name)", "TAFMER™ DF-119 (product name)", "TAFMER™ DF-110 (product name)", "TAFMER™ A-10855 (product name)", "TAFMER™ A-4070S (product name)", "TAFMER™ A-4085S (product name)", and "TAFMER™ A-4090S (product name)" from Mitsui Chemicals, Inc. Also, "m-PE KN™ KF260T (product name)", "m-PE KN™ KF270 (product name)", "m-PE KN™ KF370 (product name)", "m-PE KN™ KF360T (product name)", "m-PE KN™ KS240T (product name)", "m-PE KN™ KS340T (product name)", and "m-PE KN™ KS260 (product name)" from Japan Polyethylene Corporation can be exemplified. Furthermore, "EXCELLEN™ VL100 (product name)", "EXCELLEN™ VL102 (product name)", "EXCELLEN™ VL200 (product name)", "EXCELLEN™ FX201 (product name)", "EXCELLEN™ FX301 (product name)", "EXCELLEN™ FX307 (product name)", "EXCELLEN™ FX351 (product name)", "EXCELLEN™ FX352 (product name)", and "EXCELLEN™ FX357 (product name)" from Sumitomo Chemical Co., Ltd. can be exemplified.

The proportion of the adhesion improving agent with respect to all the resin components in the polypropylene layer is, for example, 5 mass % or more, may be 10 mass % or more, and may be 15 mass % or more. Also, the proportion of the adhesion improving agent is, for example, less than 50 mass %, may be 40 mass % or less, may be 30 mass % or less, and may be 20 mass % or less. When the proportion of the adhesion improving agent is too little, there is a possibility that the desired adhesion may not be obtained. Also, when the proportion of the adhesion improving agent is too much, there is a possibility that the transparency of the polypropylene layer may be degraded. Also, there is a risk that the heat resistance of the polypropylene layer may be degraded.

(iii) Light Stabilizer

Also, the polypropylene layer may contain a light stabilizer. When the polypropylene layer contains the light stabilizer, the ultraviolet ray deterioration of the polypropylene layer can be inhibited. As the light stabilizer, for example, usage of a hindered amine-based light stabilizer (HALS) is preferable.

The hindered amine-based light stabilizer can be the same as the hindered amine-based light stabilizer used in the polyolefin layer described above.

The content of the light stabilizer in the polypropylene layer is, for example, as the lower limit value, it is preferably 3 mass % or more, and more preferably 3.5 mass % or more. Meanwhile, as the upper limit value, it is preferably 10 mass % or less, and morepreferably 4.5 mass % or less. When the content of the light stabilizer is in the above range, the ultraviolet ray resistance of the sealing material layer can be improved. Meanwhile, when the content of the light stabilizer is too much, there is a possibility that the transparency of the polypropylene layer may be degraded due to bleed-out of the light stabilizer, and there is a possibility that the adhesion between the polypropylene layer and the polyolefin layer may be degraded.

(iv) Polypropylene-Based Elastomer

Also, the polypropylene layer may further contain a polypropylene-based elastomer (PP-based elastomer). When the polypropylene layer contains the polypropylene-based elastomer, the transparency of the polypropylene layer can be improved.

Examples of the polypropylene-based elastomer may include a copolymer of propylene and α-olefin other than propylene (it may be hereinafter referred to as propylene-α-olefin copolymer).

Examples of α-olefin configuring the propylene-α-olefin copolymer may include α-olefin with 2 or 4 to 20 carbon atoms. Specific examples thereof may include ethylene, 1-butene, 4-methyl-1-pentene, 1-pentene, 1-hexene, 1-heptene, 1-octene, 1-decene, 1-dodecene, 1-tetradecene, 1-hexadecene, 1-octadecene, and 1-eicosen. One kind or two kinds or more of these may be used.

The propylene-α-olefin copolymer is, above all, preferably the copolymer of polypropylene, ethylene, and α-olefin other than ethylene and propylene.

As the propylene-α-olefin copolymer, for example, a commercial product may be used. Examples of the commercial product may include TAFMER™ PN-3560 (product name), TAFMER™ PN-0040 (product name), and TAFMER™ PN-2060 (product name) from Mitsui Chemicals, Inc.

The proportion of the polypropylene-based elastomer with respect to all the resin components in the polypropylene layer is, for example, 5 mass % or more, may be 10 mass % or more, and may be 15 mass % or more. Also, the proportion of the polypropylene-based elastomer is, for example, less than 50 mass %, may be 40 mass % or less, may be 30 mass % or less, and may be 20 mass % or less. When the proportion of the polypropylene-based elastomer is less than the above range, there is a possibility that the effect of improving the transparency of the sealing material layer may not be obtained. Also, when the proportion of the polypropylene-based elastomer exceeds the above range, there is a risk that the heat resistance of the polypropylene layer may be degraded.

(v) Other Additives

The polypropylene layer may contain additional additive other than the above as required.

(b) Configuration of Polypropylene Layer

The polypropylene layer may be subjected to a surface treatment. When the surface treatment is performed to the surface of the polypropylene layer that is the insulating substrate side, adhesion to the second adhesive layer can be improved.

The surface treatment is not particularly limited as long as it is a surface treatment capable of improving the adhesion to the second adhesive layer, and it can be the same as the surface treatment applicable to the polyethylene-based resin layer.

The thickness of the polypropylene layer is, for example, as the lower limit value, preferably 10 μm or more, more preferably 20 μm or more, and further preferably 30 μm or more. Meanwhile, as the upper limit value, it is preferably 300 μm or less, more preferably 200 μm or less, and further preferably 100 μm or less. When the thickness of the polypropylene layer is in the above range, excellent rigidity can be obtained. Meanwhile, when the thickness of the polypropylene layer is too thick, it may be difficult to reduce the thickness and the weight of the solar cell module.

(3) Others

The thickness of the sealing material layer in the present embodiment may be, for example, as the lower limit value, 50 μm or more, is preferably 30 μm or more, and more preferably 50 μm or more. Meanwhile, as the upper limit value, it may be 400 μm or less, is preferably 300 μm or less, and more preferably 200 μm or less. In the present aspect, as described above, when the polyolefin layer configuring the sealing material layer contains the silane modified resin, it is not necessary to include a silane coupling agent for improving adhesion, and thus the thickness of the polyolefin layer can be decreased. As a result, the thickness of the sealing material layer can also be decreased.

Also, when the sealing material layer includes the above described polyolefin layer and polypropylene layer, for example, the polyolefin layer and the polypropylene layer may be layered interposing an adhesive layer, and a multilayer film of the polyolefin layer and the polypropylene layer may be formed by a coextrusion method.

Above all, the sealing material layer preferably includes a coextrusion film including the polyolefin layer and the polypropylene layer. In the case of the coextrusion film including the polyolefin layer and the polypropylene layer, it is not necessary to layer the polyolefin layer and the polypropylene layer interposing an adhesive layer, and thus the thickness of the sealing material layer can be reduced. Thereby, the overall thickness of the solar cell module insulation film can be decreased. Thus, when the solar cell module insulation film of the present embodiment is used in a solar cell module, the thickness and the weight of the solar cell module can be reduced. Also, in the case of the coextrusion film including the polyolefin layer and the polypropylene layer, the production efficiency can be improved.

4. First Adhesive Layer

The solar cell module insulation film of the present embodiment may include a first adhesive layer between the insulating substrate and the polyethylene-based resin layer. The first adhesive layer is a layer that adheres the insulating substrate and the polyethylene-based resin layer.

As the adhesive agent used in the first adhesive layer, an adhesive agent used for adhering general films can be used, and for example, conventionally known various adhesive agents such as a urethane-based adhesive agent, and an acryl-based adhesive agent can be used. Also, as the adhesive agent, for example, a two-part adhesive agent configured by a main agent including a hydroxyl group and a curing agent including an isocyanate group can also be used.

In the two-part adhesive agent, as the main agent including a hydroxyl group, for example, the one including a mixture of polyurethane diol and aliphatic polycarbonate diol is preferable. The polyurethane diol and the aliphatic polycarbonate diol configuring the main agent are both polyol including a hydroxyl group, which configures the adhesive agent by reacting with a curing agent including an isocyanate group. When the main agent is the mixture of the polyurethane diol and the aliphatic polycarbonate diol, the adhesion and the weather resistance of the first adhesive layer can be improved.

In the main agent, additives such as a tackifier, a stabilizer, a filler, a plasticizer, a softening point improver, and a catalyst can be mixed other than the polyurethane diol and the aliphatic polycarbonate diol, as required.

Also, in the two-part adhesive agent, as the curing agent including an isocyanate group, for example, a polyisocyanate compound is preferably included. The polyisocyanate compound is a compound including two or more isocyanate groups in one molecule, and the isocyanate groups react with the hydroxyl group in the main agent polyurethane diol to crosslink the polyurethane diol.

There are no particular limitations on such a polyisocyanate compound as long as it can crosslink the main agent polyurethane diol, and examples thereof may include polyurethane diisocyanate, hexamethylene diisocyanate, and isocyanurate modified isophorone diisocyanate.

The first adhesive layer may contain an additive as required.

The thickness of the first adhesive layer is appropriately selected depending on the targeted properties such as transparency and adhesive strength, and for example, it is preferably 3 μm or more and 10 μm or less.

5. Second Adhesive Layer

The solar cell module insulation film of the present embodiment may include a second adhesive layer between the insulating substrate and the sealing material layer. The second adhesive layer is a layer that adheres the insulating substrate and the sealing material layer.

As the adhesive agent used in the second adhesive layer, an adhesive agent used for adhering general films can be used, and for example, conventionally known various adhesive agents such as a urethane-based adhesive agent, and an acryl-based adhesive agent can be used. Also, as the adhesive agent, for example, a two-part adhesive agent configured by a main agent including a hydroxyl group and a curing agent including an isocyanate group can also be used. The two-part adhesive agent can be the same as the two-part adhesive agent used in the first adhesive layer described above; thus, the descriptions herein are omitted.

The second adhesive layer may contain a coloring agent. When the second adhesive layer contains the coloring agent, the colors of the region where solar cells are disposed and the region where the solar cells are not disposed can be the same when the solar cell module insulation film in the present aspect is used in a solar cell module. Thereby, the appearance and the design of the solar cell can be improved.

Also, examples of the coloring agent may include a dark color pigment. Above all, when both of the insulating substrate and the second adhesive layer respectively contain a coloring agent, it is preferable that the insulating substrate contains a white pigment and the second adhesive layer contains a dark color pigment.

When the second adhesive layer contains the dark color pigment, it can transmit a near-infrared ray and an infrared ray. For this reason, when the second adhesive layer contains the dark color pigment and the insulating substrate contains the white pigment, the second adhesive layer can transmit the near-infrared ray, and the insulating substrate can reflect the near-infrared ray, and thus attenuation of the near-infrared ray can be suppressed without absorbing the near-infrared ray contributing to power generation of the solar cell by the second adhesive layer and the insulating substrate. As a result, the degrade of power generation efficiency due to temperature rise of the solar cell module, and the degrade of power generation efficiency of the solar cell module due to attenuation of the near-infrared ray can be inhibited. Also, when the second adhesive layer contains the dark color pigment and the insulating substrate contains the white pigment, the second adhesive layer can transmit the near-infrared ray and the infrared ray, and the insulating substrate can reflect the near-infrared ray and the infrared ray, and thus when the solar cell module insulation film in the present aspect is used in a solar cell module, the temperature rise of the solar cell module due to absorption of the near-infrared ray and the infrared ray can be inhibited. Also, when the near-infrared ray reflected by the insulating substrate is taken in to the surface of the solar cell, the power generation efficiency improves.

The dark color pigment can be the same as the dark color pigment used in the insulating substrate described above; thus, the descriptions herein are omitted.

The content of the dark color pigment in the second adhesive layer is, for example, preferably 10 mass % or more and 40 mass % or less, more preferably 15 mass % or more and 35 mass % or less, and further preferably 20 mass % or more and 30 mass % or less. When the content of the dark color pigment is in the above range, the second adhesive layer may have high adhesion, design, and transmission of near-infrared ray and infrared ray.

The second adhesive layer may contain an additive other than the above as required.

6. Solar Cell Module Insulation Film

In the present embodiment, when a surface of the solar cell module insulation film that is the polyethylene-based resin layer side is thermally compressed to a steel sheet, an adhesive force of the polyethylene-based resin layer with respect to the steel sheet is, for example, preferably 3N/15 mm or more, more preferably 5N/15 mm or more, and further preferably 10N/15 mm or more. When the adhesive force is in the above range, since the adhesion of the solar cell module insulation film and the steel sheet is well, when the solar cell module insulation film in the present aspect is used in a solar cell module, the reliability and the durability of the solar cell module can be improved.

Here, the adhesive force refers to an average peel force obtained by averaging the measurement result of measurement number N=3 by an adhesion test shown below in accordance with JIS-K-8654-1-1999.

In the adhesion test, a test piece of the solar cell module insulation film cut into a size of 75 mm*100 mm and an acryl-coated steel sheet having a thickness of 0.35 mm and a size of 75 mm*50 mm are used. First, the test piece of the solar cell module insulation film is adhered to a coated surface of the coated steel sheet by facing a surface of the solar cell module insulation film that is the polyethylene-based resin layer side to the coated steel sheet side. Also, a release film (such as an ethylene-tetrafluoroethylene copolymer (ETFE) film) having a size of 75 mm*60 mm is inserted in a part between the coated steel sheet and the solar cell module insulation film. Next, a thermal compression by a vacuum laminator is performed with the below conditions. After that, the release film is removed to make a chance of peeling of the below peeling test. Next, to the test piece of the solar cell module insulation film adhered to the steel sheet, 180° peeling test at a peeling speed of 50 mm/min is performed using a peeling test machine to measure the adhesive force. The details of the measurement method of the adhesive force are as described in Examples.

<Heat Laminate Conditions>

Vacuum drawing: 5 minutes

Pressing: the pressure was raised from 0 kPa to 100 kPa over 1 minute and 30 seconds.

Pressure keeping (100 kPa): 7.5 minutes

Temperature: 150° C.

The method for producing the solar cell module insulation film of the present embodiment is not particularly limited, and examples thereof may include a method in which the polyethylene-based resin layer, the insulating substrate, and the sealing material layer are layered interposing an adhesive agent by the dry laminating method.

II. Second Embodiment

The second embodiment of the solar cell module insulation film in the present aspect includes a sealing material layer, an insulating substrate, and a polyethylene-based resin layer, in this order, wherein a thickness of the polyethylene-based resin layer is 30 μm or more and 300 μm or less; and a wetting tension of a surface of the polyethylene-based resin layer that is opposite side to the insulating substrate is 36 dyne/cm or more.

FIG. 1 is a schematic cross-sectional view showing an example of the solar cell module insulation film of the present embodiment. As shown in FIG. 1, solar cell module insulation film 1 includes sealing material layer 2, insulating substrate 3, and polyethylene-based resin layer 4, in this order. Also, the polyethylene-based resin layer 4 has the specified thickness, and a surface of the polyethylene-based resin layer 4 that is opposite side to the insulating substrate 3 has the specified wetting tension.

As shown in FIG. 1, the solar cell module insulation film 1 of the present embodiment may include first adhesive layer 5 between the insulating substrate 3 and the polyethylene-based resin layer 4. Also, the solar cell module insulation film 1 of the present embodiment may include second adhesive layer 6 between the insulating substrate 3 and the sealing material layer 2.

The solar cell module insulation film of the present embodiment is a member disposed between the solar cell and the steel sheet in the solar cell module, and the sealing material layer is disposed in the solar cell side, and the polyethylene-based resin layer is disposed in the steel sheet side. In the present embodiment, since the surface of the polyethylene-based resin layer that is opposite side to the insulating substrate has the specified wetting tension, the adhesion to the steel sheet used in the solar cell module can be improved.

Also, in the present embodiment, the polyethylene-based resin layer has the specified thickness, and the thickness is comparatively thin. Thus, the overall thickness of the solar cell module insulation film can be decreased. Therefore, when the solar cell module insulation film of the present embodiment is used in a solar cell module, it is possible to decrease the thickness and the weight of the solar cell module.

Also, the solar cell module insulation film of the present embodiment is the one in which the sealing material layer, the insulating substrate and the polyethylene-based resin layer are integrated in advance. Thus, when the solar cell module insulation film of the present embodiment is used to produce a solar cell module, for example, the transparent substrate, the sealing material sheet, the solar cell, the solar cell module insulation film, and the steel sheet may be layered in the order and integrated by the thermal compression, which results in reduction of the number of steps and members, and in improvement of the productivity.

Further, in the present embodiment, since the polyethylene-based resin layer has the specified thickness and the thickness is comparatively thin, the sealing material layer, the insulating substrate and the polyethylene-based resin layer can be layered by the dry laminating method. Thus, in the solar cell module insulation film, the sealing material layer, the insulating substrate and the polyethylene-based resin layer can be integrated in advance.

Also, the solar cell module insulation film of the present embodiment includes the insulating substrate between the sealing material layer and the polyethylene-based resin layer, and thus the insulation can be improved, and the short circuit defect between the electrode in the solar cell and the steel sheet can be inhibited.

In the solar cell module insulation film of the present embodiment, the insulating substrate, the sealing material layer, the first adhesive layer, the second adhesive layer, properties of the solar cell module insulation film and the method for producing the solar cell module insulation film can be the same as those of the first embodiment described above; thus, the descriptions herein are omitted.

In the solar cell module insulation film of the present embodiment, the polyethylene-based resin layer has the specified thickness. The thickness of the polyethylene-based resin layer can be the same as the thickness of the polyethylene film in the first embodiment described above; thus, the descriptions herein are omitted. Also, other points of the polyethylene-based resin layer can be the same as those of the first embodiment described above; thus, the descriptions herein are omitted.

B. Insulation Film with Steel Sheet

The insulation film with a steel sheet in the present aspect includes the above described solar cell module insulation film, and a steel sheet disposed on a surface of the solar cell module insulation film that is the polyethylene-based resin layer side.

Figure 3:
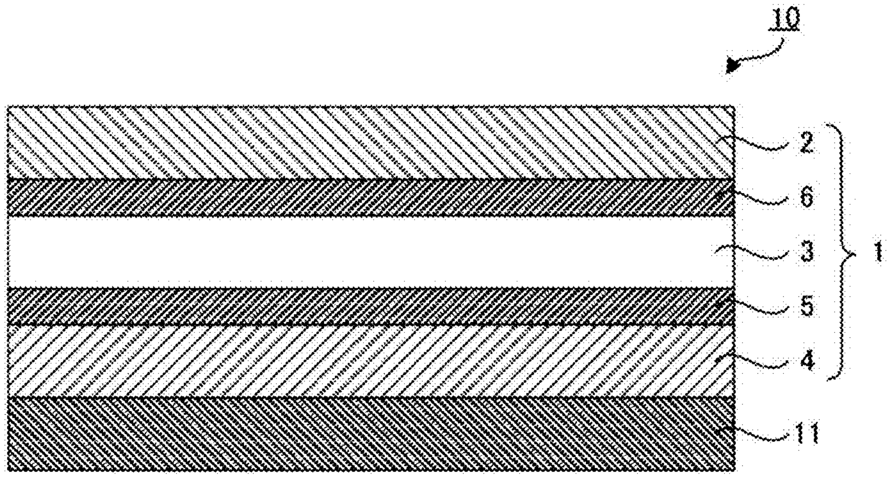
FIG. 3 is a schematic cross-sectional view exemplifying the insulation film with steel sheet in the first aspect of the present disclosure.

FIG. 3 is a schematic cross-sectional view showing an example of the insulation film with a steel sheet in the present aspect. As shown in FIG. 3, insulation film with a steel sheet 10 includes solar cell module insulation film 1, and steel sheet 11 disposed on a surface of the solar cell module insulation film 1 that is polyethylene-based resin layer 4 side. The configuration of the solar cell module insulation film 1 is the same as the solar cell module insulation film 1 shown in FIG. 1 described above.

In the present aspect, the above described solar cell module insulation film is included, and thus the adhesion of the solar cell module insulation film and the steel sheet can be improved. Also, when the insulation film with a steel sheet in the present aspect is used in a solar cell module, the thickness and the weight of the solar cell module can be reduced. Further, when a solar cell module is produced using the insulation film with a steel sheet in the present aspect, the productivity can be improved. Also, the insulation of the solar cell module insulation film can be improved, and the occurrence of short circuit defect of the electrode in the solar cell and the steel sheet can be inhibited.

Each configuration of the insulation film with a steel sheet in the present aspect will be hereinafter explained.

1. Solar Cell Module Insulation Film

The solar cell module insulation film in the present aspect is in the same contents as those described in the section "A. Solar cell module insulation film" above; thus, the descriptions herein are omitted.

2. Steel Sheet

The steel sheet in the present aspect is a member disposed on a surface of the solar cell module insulation film that is the polyethylene-based resin layer side.

As the steel sheet, for example, a steel sheet in which a coating layer is disposed on a surface, so-called a coated steel sheet is preferably used. There are no particular limitations on a coating material to be coated on the surface of the steel sheet, and a coating material used for a general coated steel sheet can be used. Examples thereof may include an acryl-based coating material, a polyester-based coating material, a fluorine-based coating material, an acryl fluorine-based coating material, an epoxy-based coating material, and a urethane-based coating material. In other words, examples of the coated steel sheet may include an acryl-based coated steel sheet, a polyester-based coated steel sheet, a fluorine-based coated steel sheet, an acryl fluorine-based coated steel sheet, an epoxy-based coated steel sheet, and a urethane-based coated steel sheet.

Also, a primer layer may be disposed between the steel sheet and the coating layer. There are no particular limitations on the primer layer, and a primer layer used for a general coated steel sheet can be used.

Also, the steel sheet configuring the coated steel sheet is not particularly limited, and examples thereof may include a zinc plated steel sheet, a Galvalume steel sheet (registered trademark), a stainless steel sheet, and a clad steel sheet.

The thickness of the steel sheet is not particularly limited, and appropriately selected depending on applications of the solar cell module in the present aspect.

3. Insulation Film with Steel Sheet

Examples of the method for producing the insulation film with steel sheet in the present aspect may include a method in which a layered body including a release film, a solar cell module insulation film, and a steel sheet is thermally compressed and integrated. Examples of the thermal compression may include a vacuum heat laminating method. As the release film, for example, films such as an ethylene-tetrafluoro ethylene copolymer (ETFE) film, and a release polyethylene terephthalate (PET) film may be used.

C. Solar Cell Module

The solar cell module in the present aspect includes a transparent substrate, a sealing material sheet, a solar cell, the above described solar cell module insulation film, and a steel sheet in this order.

Figure 4:
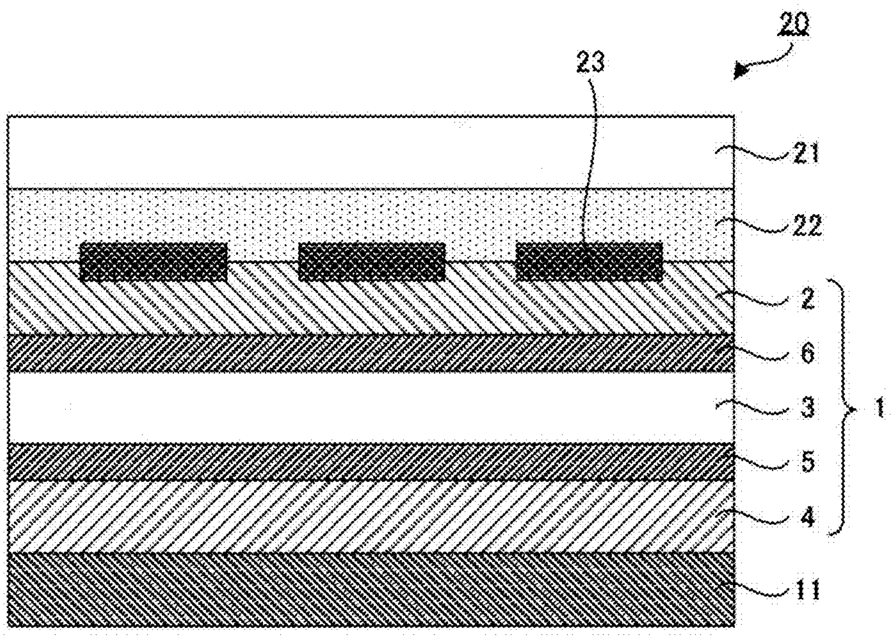
FIG. 4 is a schematic cross-sectional view exemplifying the solar cell module in the first aspect of the present disclosure.

FIG. 4 is a schematic cross-sectional view showing an example of the solar cell module in the present aspect. As shown in FIG. 4, solar cell module 20 includes transparent substrate 21, sealing material sheet 22, solar cell 23, solar cell module insulation film 1, and steel sheet 11, in this order.

In the present aspect, the above described solar cell module insulation film is included, and thus the adhesion of the solar cell module insulation film and the steel sheet can be improved. Also, the thickness and the weight of the solar cell module can be reduced. Further, productivity can be improved. Also, the insulation of the solar cell module insulation film can be improved, and the occurrence of short circuit defect in the solar cell of the electrode and the steel sheet can be inhibited.

The configuration of the solar cell module in the present aspect will be hereinafter explained.

1. Solar Cell Module Insulation Film

The solar cell module insulation film in the present aspect is in the same contents as those described in the section "A. Solar cell module insulation film" above; thus, the descriptions herein are omitted.

2. Steel Sheet

The steel sheet in the present aspect is in the same as the steel sheet described in the section "B. Insulation film with steel sheet" above; thus, the descriptions herein are omitted.

3. Solar Cell

The solar cell in the present aspect is not particularly limited, and examples thereof may include a monocrystal silicon solar cell, a polycrystal silicon solar cell, an amorphous silicon solar cell, a compound semiconductor-based solar cell, a dye-sensitized type solar cell, a quantum dot type solar cell, and an organic thin film type solar cell.

Features such as a size and a form of the solar cell can be appropriately selected depending on applications of the solar cell module.

4. Transparent Substrate

The transparent substrate in the present aspect is a member that protects the solar cell. Also, the transparent substrate is disposed in a light receiving surface side of the solar cell, and works as a surface protecting member. The transparency of the transparent substrate is not particularly limited if it is to the extent that does not inhibits the power generation of the solar cell. The transparent substrate may be the same as a transparent substrate used in a general solar cell module; thus, the descriptions herein are omitted.

5. Sealing Material Sheet

The sealing material sheet in the present aspect is a member that seals the solar cell. The sealing material sheet is disposed in a light receiving surface side of the solar cell.

The sealing material sheet can be the same as a sealing material sheet used in a general solar cell module; thus, the descriptions herein are omitted.

6. Method for Producing Solar Cell Module

The method for producing the solar cell module in the present aspect is not particularly limited, and examples thereof may include a method in which a layered body including a transparent substrate, a sealing material sheet, a solar cell, a solar cell module insulation film, and a steel sheet is thermally compressed and integrated. Examples of the thermal compression may include a vacuum heat laminating method.

β. Second Aspect

Next, the second aspect of the solar cell module insulation film, the insulation film with wiring sheet, and the solar cell module in the present disclosure will be explained in details.

A. Solar Cell Module Insulation Film

The solar cell module insulation film in the present aspect is a member disposed between a solar cell and a wiring sheet in a solar cell module, and includes at least an insulating substrate and a wiring sheet side sealing material layer including a polyethylene layer. The solar cell module insulation film in the present aspect includes four embodiments. In the following, each embodiment will be explained separately.

I. First Embodiment

The first embodiment of the solar cell module insulation film in the present aspect includes an insulating substrate of which thermal shrinkage in a MD direction is 2.0% or less and in a TD direction is 1.5% or less, when kept at 150° C. for 30 minutes, and a wiring sheet side sealing material layer that is disposed on one surface of the insulating substrate and includes a polyethylene layer, wherein a wetting tension of a surface of the polyethylene layer that is opposite side to the insulating substrate is 36 dyne/cm or more.

Figure 5:
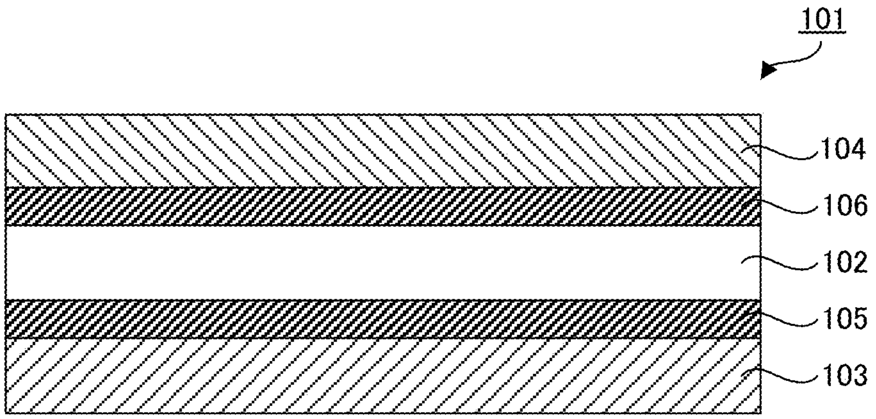
FIG. 5 is a schematic cross-sectional view exemplifying the solar cell module insulation film in the second aspect of the present disclosure.

FIG. 5 is a schematic cross-sectional view showing an example of the solar cell module insulation film of the present embodiment. As shown in FIG. 5, solar cell module insulation film 101 includes insulating substrate 102, and wiring sheet side sealing material layer 103 that is disposed on one surface of the insulating substrate 102 and includes a polyethylene layer. The insulating substrate 102 has the specified thermal shrinkage, and also, the surface of the polyethylene layer that is opposite side to the insulating substrate 102 of the wiring sheet side sealing material layer 103 has the specified wetting tension.

As shown in FIG. 5, the solar cell module insulation film 101 of the present embodiment may include solar cell side sealing material layer 104 on a surface of the insulating substrate 102 that is opposite side to the wiring sheet side sealing material layer 103. Also, the solar cell module insulation film 101 of the present embodiment may include first adhesive layer 105 between the insulating substrate 102 and the wiring sheet side sealing material layer 103. Also, the solar cell module insulation film 101 of the present embodiment may include second adhesive layer 106 between the insulating substrate 102 and the solar cell side sealing material layer 104.

The solar cell module insulation film of the present embodiment includes the insulating substrate, and the insulating substrate has the specified thermal shrinkage, and thus it is superior in size stability and the size stability of the solar cell module insulation film overall can be improved. Thus, when a solar cell module is produced using the solar cell module insulation film of the present embodiment, in a process of integration by thermal compression after forming a penetration hole in the solar cell module insulation film, positional deviation of the penetration hole of the solar cell module insulation film to an electrode of the solar cell and to a wiring of the wiring sheet can be inhibited. Thereby, the reliability of the solar cell module improves.

Also, in the present embodiment, the wiring sheet side sealing material layer includes the polyethylene layer, and the surface of the polyethylene layer that is opposite side to the insulating substrate has the specified wetting tension, and thus the adhesion to the wiring of the wiring sheet used in the solar cell module can be improved.

Also, the solar cell module insulation film of the present embodiment includes the insulating substrate, and thus the insulation can be improved, and occurrence of short circuit defect of the electrode of the solar cell and the wiring of the wiring sheet can be inhibited.

Each configuration of the solar cell module insulation film of the present embodiment will be hereinafter explained.

1. Wiring Sheet Side Sealing Material Layer

The wiring sheet side sealing material layer in the present embodiment is disposed on one surface of the insulating substrate, and includes at least a polyethylene layer. Also, a wetting tension of a surface of the polyethylene layer that is opposite side to the insulating substrate is the specified value or more.

(1) Polyethylene Layer

The polyethylene layer in the present embodiment is a member configuring the wiring sheet side sealing material layer, and is a member disposed on the outermost surface in the wiring sheet side sealing material layer, that is opposite side surface to the insulating substrate.

(a) Properties of Polyethylene Layer

In the present embodiment, the witting tension of the surface of the polyethylene layer that is opposite side to the insulating substrate is 36 dyne/cm or more, preferably 40 dyne/cm or more, and more preferably 46 dyne/cm or more. When the wetting tension is in the above range, the adhesion to the wiring of the wiring sheet can be improved. Meanwhile, the larger the wetting tension, the more preferable, and there is no particular upper limit of the wetting tension.

Here, the wetting tension of the surface of the polyethylene layer that is opposite side to the insulating substrate can be measured in accordance with JIS K6768-1999 (Plastic film and sheet wetting tension test method). The details of the measurement method of the wetting tension are as described in Examples.

As the method for adjusting the wetting tension of the surface of the polyethylene layer that is opposite side to the insulating substrate to the above range may be, for example, a method in which the surface of the polyethylene layer that is opposite side to the insulating substrate is subjected to a surface treatment.

The polyethylene layer is preferably subjected to the surface treatment. When the surface of the polyethylene layer that is opposite side to the insulating substrate is subjected to the surface treatment, as described above, the wetting tension of the surface of the polyethylene layer that is opposite side to the insulating substrate can be adjusted to the specified range, and the adhesion to the wiring of the wiring sheet can be improved. Meanwhile, when the surface of the polyethylene layer that is the insulating substrate side is subjected to the surface treatment, the adhesion to the first adhesive layer can be improved.

The surface treatment is not particularly limited if it is a surface treatment capable of adjusting the wetting tension of the surface of the polyethylene layer that is opposite side to the insulating substrate to the specified range, and examples thereof may include a corona treatment, a plasma treatment, an ultraviolet ray treatment, an electron ray treatment, and a frame treatment. Among those, the corona treatment is preferable from the views of processing cost and reducing damages to the polyethylene layer.

The polyethylene layer is not particularly limited if it can be used as a sealing material of the solar cell module, but above all, a non-crosslinking polyethylene layer is preferable.

Here, conventionally, as the sealing material sheet used in a solar cell module, for example, a crosslinking sealing material sheet such as a sealing sheet containing a crosslinking agent and using an ethylene-vinyl acetate copolymer (EVA) as a base resin, and a sealing material sheet containing a crosslinking agent and using a polyolefin resin as a base resin, have been known. These crosslinking sealing material sheets are uncrosslinked resin films, and will be crosslinked by heating during the production of the solar cell module and heating in other crosslinking steps.

In contrast, since the non-crosslinking polyethylene layer does not require the crosslinking step when a solar cell module is produced using the solar cell module insulation film of the present embodiment, the production cost and the production time can be reduced.

In addition, conventionally, in a sealing material sheet used in a solar cell module, a silane coupling agent is added for improving the adhesion of the solar cell, a frontside protective sheet and a backside protective sheet. Also, when the crosslinking sealing material sheet contains a silane coupling agent in addition to the crosslinking agent, the crosslinking reaction of the base resin and the graft reaction of the silane coupling agent to the base resin are necessary, so the range of heating conditions during the production of the solar cell module will be narrow. Further, when the crosslinking sealing material sheet contains the silane coupling agent in addition to the crosslinking agent, and when the sealing material sheet, the insulating substrate, and the sealing material sheet are layered by the dry laminating method, after pasting the adhesive agent for dry laminating, the crosslinking agent and the silane coupling agent included in the crosslinking sealing material sheet are volatilized at the time of drying the solvent included in the adhesive agent for dry laminating. For this reason, it is difficult to layer the crosslinking sealing material sheet, the insulating substrate, and the crosslinking sealing material sheet by the dry laminating method.

In contrast, in the present embodiment, as described above, the wetting tension of the surface of the polyethylene layer that is opposite side to the insulating substrate is in the specified range, and thus the adhesion to the wiring of the wiring sheet can be improved. For this reason, it is not necessary to include the silane coupling agent for improving adhesion. In this manner, the non-crosslinking polyethylene layer does not contain the crosslinking agent, and in the present embodiment, it is not necessary to include the silane coupling agent for improving adhesion, and thus the range of heating conditions during the production of the solar cell module can be widened. Also, since the non-crosslinking polyethylene layer does not contain the crosslinking agent, and it is not necessary to include the silane coupling agent in the present embodiment, it is suitable for layering by the dry laminating method.

Also, in general, in the crosslinking polyethylene layer, a resin with comparatively high melt mass flow rate (MFR) and comparatively low melting point is used. On the occasion of forming a thin layer of the resin composition including such a base resin, when the layer formation speed is fast, it is not cooled in time and there is a high possibility of a phenomenon occurrence that the sealing material sheet will be removed by the rubber roll.

In contrast, in general, in the non-crosslinking polyethylene layer, from the viewpoint of heat resistance, a resin with comparatively high melting point is used, and in this case, the density of the resin is also high, and the melt mass flow rate (MFR) of the resin tends to be comparatively low. Thus, the occurrence of the defect as described above can be inhibited.

The non-crosslinking polyethylene layer usually does not contain a crosslinking agent. When the polyethylene layer does not contain the crosslinking agent, it can be said that it is the non-crosslinking polyethylene layer. In other words, the polyethylene layer preferably does not contain the crosslinking agent.

Note that the presence or absence of the crosslinking agent in the polyethylene layer can be analyzed by a gas chromatography mass analysis method (GC-MS).

Also, a gel content of the non-crosslinking polyethylene layer is usually 0%. When the gel content of the non-crosslinking polyethylene layer is 0%, it can be said that it is the non-crosslinking polyethylene layer. In other words, the gel content of the polyethylene layer is preferably 0%.

Here, the “gel content (%)” in the present specification refers to a gel content obtained by putting 1.0 g of the sample to a resin mesh, extracting for 24 hours in a xylene at 110° C., and then taking out the resin mesh and weighing thereof after a dry treatment, and conducting a mass comparison of before and after the extraction to measure a mass % of a residual insoluble matter.

Note that the gel content 0% means that the residual insoluble matter is substantially 0. In more specific, “the gel content 0%” refers to a case where the residual insoluble matter is not present at all, and a case where the mass % of the residual insoluble matter measured by a precision balance is less than 0.05 mass %.

Also, the residual insoluble matter does not include components such as a pigment component other than the resin component. When foreign substances other than these resin components are included in the residual insoluble matter by the test, for example, the gel content that should be obtained for the residual insoluble component derived from the resin component other than these foreign substances can be calculated by measuring the content of these foreign substances in the resin component separately in advance.

As described later, when the polyethylene layer contains a silane modified resin, a crosslinking reaction of the silane modified resin proceeds during the storage of the solar cell module insulation film, and the gel content of the polyethylene layer may be, for example, to the extent of 2% or more and 10% or less. Meanwhile, when a solar cell module is produced using a crosslinking sealing material sheet, the gel content of the sealing material sheet in the solar cell module usually exceeds 50%. For this reason, when the polyethylene layer contains the silane modified resin, it can be the non-crosslinking polyethylene layer even if the gel content of the polyethylene layer is, for example, 15% or less.

(b) Materials of Polyethylene Layer (i) Polyethylene-Based Resin

The polyethylene layer contains a polyethylene-based resin. The composition, density and melting point of the polyethylene-based resin in the present aspect are the same as the explanations of the polyethylene-based resin used in the polyethylene-based resin layer in "a. First aspect A. Solar cell module insulation film I. First embodiment 1. Polyethylene-based resin layer"; thus, the descriptions herein are omitted.

Also, the point relating to the resin component of the polyethylene layer is also the same as the explanations of the polyethylene-based resin layer in "a. First aspect A. Solar cell module insulation film I. First embodiment 1. Polyethylene-based resin layer"; thus, the descriptions herein are omitted.

(ii) Silane Modified Resin

In the present embodiment, the polyethylene layer preferably contains a silane modified resin. When the polyethylene layer contains the silane modified resin, the adhesion to the wiring of the wiring sheet, strength and durability can be improved.

Here, as described above, conventionally, in the sealing material sheet used in a solar cell module, a silane coupling agent is added for improving adhesion of the solar cell, the frontside protective sheet and the backside protective sheet. When the sealing material sheet contains the silane coupling agent, for example, in the case of producing the sealing material sheet by a roll-to-roll method, the silane coupling agent included in the sealing material sheet may be adhered to the roll, and the silane coupling agent included in the sealing material sheet may be transferred to the other surface of the sealing material sheet, when overlapping the sealing material sheet. The thinner the thickness of the sealing material sheet, the more the influence of the adhering or transfer of the silane coupling agent to the adhesion. For this reason, when the sealing material sheet contains the silane coupling agent, the sealing material sheet needs to be thick.

In contrast, in the present embodiment, when the polyethylene layer contains the silane modified resin, it is not necessary to include the silane coupling agent for improving adhesion, and thus the thickness of the polyethylene layer can be decreased. Thereby, the overall thickness of the solar cell module insulation film can be decreased. Thus, when the solar cell module insulation film of the present embodiment is used in a solar cell module, the amount of use of a conductive material, which is disposed in the penetration hole of the solar cell module insulation film, and is used for forming a conductive part electronically connecting the electrode of the solar cell and the wiring of the wiring sheet, can be reduced, and the production cost can be reduced. Also, when the solar cell module insulation film of the present embodiment is used in a solar cell module, the thickness and the weight of the solar cell module can be reduced.

The composition of the silane modified resin used in the present aspect is the same as the explanations in "ax. First aspect A. Solar cell module insulation film I. First embodiment 3. Sealing material layer (1) Polyolefin layer (a) Materials of polyolefin layer (ii) Silane modified resin"; thus, the descriptions herein are omitted.

(iii) Light Stabilizer

Also, the polyethylene layer may contain a light stabilizer. When the polyethylene layer contains the light stabilizer, ultraviolet ray deterioration of the polyethylene layer can be inhibited. As the light stabilizer, for example, usage of a hindered amine-based light stabilizer (HALS) is preferable.

The light stabilizer used in the present aspect is the same as the explanations in "α. First aspect A. Solar cell module insulation film I. First embodiment 3. Sealing material layer (1) Polyolefin layer (a) Materials of polyolefin layer (iii) Light stabilizer"; thus, the descriptions herein are omitted.

(iv) Other Additives

The polyethylene layer may contain an additive other than the above as required.

Here, the ratio of each resin component included in each layer of the solar cell module insulation film of the present embodiment can be analyzed by a peak ratio or the like detected from a nuclear magnetic resonance (NMR).

(c) Configuration of Polyethylene Layer

The thickness of the polyethylene layer is, from the viewpoint of sealing properties and the like, for example, the lower limit value is preferably 10 μm or more, more preferably 20 μm or more, and further preferably 30 μm or more. Meanwhile, the upper limit value is preferably 300 μm or less, more preferably 200 μm or less, and further preferably 100 μm or less. In the present embodiment, as described above, when the polyethylene layer contains the silane modified resin, it is not necessary to include the silane coupling agent for improving adhesion, and thus the thickness of the polyethylene layer can be decreased. Meanwhile, when the thickness of the polyethylene layer is too thick, as described later, when the solar cell module insulation film includes a penetration hole, there is a possibility that making the penetration hole may be difficult.

Here, the thickness of the polyethylene layer can be an average value of the thicknesses of arbitrary 10 points obtained by measuring the cross-section of the thickness direction of the solar cell module insulation film observed with an optical microscope. Note that the measurement method for the thickness of the other members can be the same unless otherwise described. Also, the thickness of the polyethylene layer can be measured by peeling off the polyethylene layer from the solar cell module insulation film, and the thickness of the polyethylene layer can be obtained by peeling off the polyethylene layer from the solar cell module insulation film to measure the difference in thickness between the thickness of overall solar cell module insulation film and the thickness of the solar cell module insulation film after peeling off the polyethylene layer therefrom. In this case, the thickness can be measured by, for example, a micrometer and a weighing method.

(2) Polypropylene Layer

Figure 6:
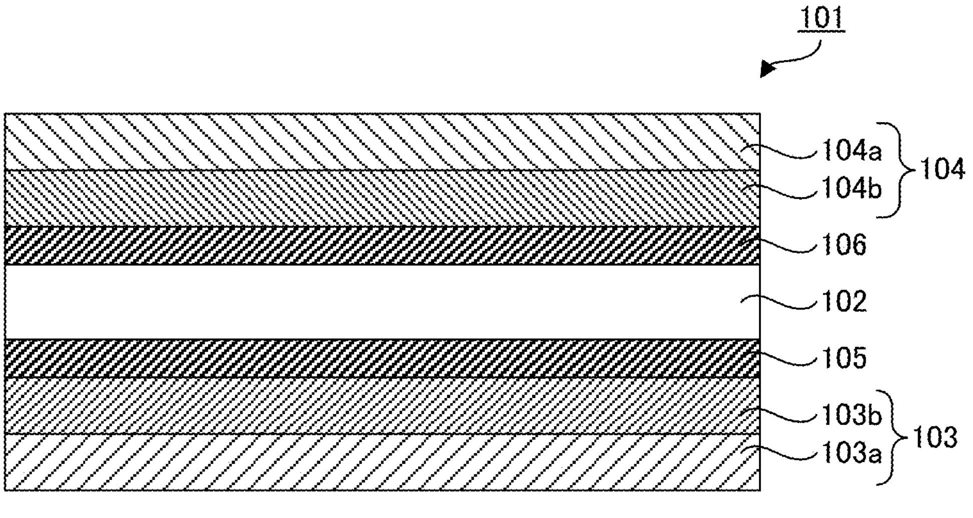
FIG. 6 is a schematic cross-sectional view exemplifying the solar cell module insulation film in the second aspect of the present disclosure.

In the present embodiment, the wiring sheet side sealing material layer preferably includes a polypropylene layer between the polyethylene layer and the insulating substrate. For example, in FIG. 6, wiring sheet side sealing material layer 103 includes polypropylene layer 103*b* between polyethylene layer 103*a* and insulating substrate 102. When the wiring sheet side sealing material layer includes the polypropylene layer, the wiring sheet side sealing material layer can have rigidity usable as a sealing material film. Thus, even when the thickness of the polyethylene layer is thin, inclusion of the polypropylene layer in the wiring sheet side sealing material layer facilitates the handling of the wiring sheet side sealing material layer. Further, the size stability of the solar cell module insulation film can be improved.

(a) Materials of Polypropylene Layer (i) Polypropylene Resin

The polypropylene layer contains a polypropylene resin. The polypropylene resin used in the present aspect is the same as the explanations in "α. First aspect A. Solar cell module insulation film I. First embodiment (2) Polypropylene layer (i) Polypropylene resin"; thus, the descriptions herein are omitted.

(ii) Adhesion Improving Agent

In the present embodiment, the polypropylene layer preferably contains an adhesion improving agent for improving the adhesion to the polyethylene layer.

The adhesion improving agent used in the present aspect is the same as the explanations in "α. First aspect A. Solar cell module insulation film I. First embodiment (2) Polypropylene layer (ii) Adhesion improving agent"; thus, the descriptions herein are omitted.

(iii) Light Stabilizer

Also, the polypropylene layer may contain a light stabilizer.

The light stabilizer used in the polypropylene layer in the present aspect is the same as the explanations in "α. First aspect A. Solar cell module insulation film I. First embodiment (2) Polypropylene layer (iii) Light stabilizer"; thus, the descriptions herein are omitted.

(iv) Polypropylene-Based Elastomer

Also, the polypropylene layer may further contain a polypropylene-based elastomer (PP-based elastomer). When the polypropylene layer contains the polypropylene-based elastomer, the transparency of the polypropylene layer can be improved.

The polypropylene-based elastomer used in the present aspect is the same as the explanations in "α. First aspect A. Solar cell module insulation film I. First embodiment (2) Polypropylene layer (iv) Polypropylene-based elastomer"; thus, the descriptions herein are omitted.

(v) Other Additives

The polypropylene layer may contain an additive other than the above as required.

(b) Configuration of Polypropylene Layer

The polypropylene layer may be subjected to a surface treatment. When the surface of the polypropylene layer that is the insulating substrate side is subjected to the surface treatment, adhesion to the first adhesive layer can be improved.

There are no particular limitations on the surface treatment as long as it is a surface treatment capable of improving the adhesion to the first adhesive layer, and it may be the same as the surface treatment applicable to the polyethylene layer.

The thickness of the polypropylene layer is, for example, as the lower limit value, preferably 10 μm or more, more preferably 20 μm or more, and further preferably 30 μm or more. Meanwhile, as the upper limit value, it is preferably 300 μm or less, more preferably 200 μm or less, and further preferably 100 μm or less. When the thickness of the polypropylene layer is in the above range, excellent rigidity can be obtained. Meanwhile, when the thickness of the polypropylene layer it too thick, as described later, when the solar cell module insulation film includes a penetration hole, there is a possibility that forming the penetration hole may be difficult. Also, it may be difficult to reduce the thickness and the weight of the solar cell module.

(3) Others

The thickness of the wiring sheet side sealing material layer in the present embodiment may be, for example, as the lower limit value, 30 μm or more, and is preferably 50 μm or more. Meanwhile, the upper limit value may be 400 μm or less, is preferably 300 μm or less, and further preferably 200 μm or less. In the present embodiment, as described above, when the polyethylene layer contains the silane modified resin, it is not necessary to include the silane coupling agent for improving adhesion, and thus the thickness of the polyethylene layer can be decreased. As a result, the thickness of the wiring sheet side sealing material layer can also be decreased.

Also, when the wiring sheet side sealing material layer includes the polyethylene layer and the polypropylene layer, for example, the polyethylene layer and the polypropylene layer may be layered interposing an adhesive layer, and a multilayer film of the polyethylene layer and the polypropylene layer may be formed by a coextrusion method.

Above all, the wiring sheet side sealing material layer preferably includes a coextrusion film including the polyethylene layer and the polypropylene layer. In the case of the coextrusion film including the polyethylene layer and the polypropylene layer, it is not necessary to layer the polyethylene layer and the polypropylene layer by interposing an adhesive layer, and thus the thickness of the wiring sheet side sealing material layer can be reduced. Thereby, the overall thickness of the solar cell module insulation film can be decreased. Thus, when the solar cell module insulation film of the present embodiment is used in a solar cell module, the amount of use of a conductive material, which is disposed in the penetration hole of the solar cell module insulation film, and is used for forming a conductive part electronically connecting the electrode of the solar cell and the wiring of the wiring sheet, can be reduced, and the production cost can be reduced. Also, when the solar cell module insulation film of the present embodiment is used in a solar cell module, the thickness and the weight of the solar cell module can be reduced. Also, in the case of the coextrusion film including the polyethylene layer and the polypropylene layer, the production efficiency improves.

2. Insulating Substrate

In the insulating substrate in the present embodiment, the rates of dimensional change (thermal shrinkage) in a MD direction and a TD direction when kept at 150° C. for 30 minutes are respectively the specified value or less.

In the insulating substrate, the rate of dimensional change in the MD direction when kept at 150° C. for 30 minutes is 2.0% or less, preferably 1.5% or less, and more preferably 1.0% or less.

Also, in the insulating substrate, the rate of dimensional change in the TD direction when kept at 150° C. for 30 minutes is 1.5% or less, preferably 1.0% or less, and more preferably 0.5% or less.

Further, in the insulating substrate, it is preferable that the rate of dimensional change in the MD direction is 1.5% or less and in the TD direction is 1.0% or less, and it is more preferable that the rate of dimensional change in the MD direction is 1.0% or less and in the TD direction is 0.5% or less, when kept at 150° C. for 30 minutes.

When the rate of dimensional change of the insulating substrate is in the above range, the size stability of the solar cell module insulation film can be improved. Thereby, as described later, when the solar cell module insulation film includes a penetration hole in a position corresponding to the electrode of the solar cell and to the wiring of the wiring sheet, when the solar cell module insulation film is used in a solar cell module, the positional deviation of the penetration hole of the solar cell module insulation film, the electrode of the solar cell, and the wiring of the wiring sheet, can be inhibited. Meanwhile, the lower limit of the rate of dimensional change may be 0% or more.

The MD direction of the insulating substrate is usually a longer side direction of the insulating substrate. Also, the TD direction of the insulating substrate is usually a shorter side direction of the insulating substrate.

Also, the rate of dimensional change of the insulating substrate can be measured by, for example, a method in accordance with JIS-K-7133:1999. The details of the measurement method of the rate of dimensional change of the insulating substrate are as described in Examples. The rate of dimensional change is calculated by the following equation:

$$(\text{Dimension after heat treatment} - \text{dimension before heat treatment}) / \text{dimension before heat treatment} * 100\%.$$

As the insulating substrate, for example, a resin substrate including insulating properties can be used. There are no particular limitations on the resin configuring the insulating substrate as long as the insulating substrate with the above described thermal shrinkage can be obtained therewith, and examples thereof may include a polyethylene terephthalate, a polyethylene naphthalate, a polybutylene terephthalate, a polyimide, a polyamide, a polycarbonate, and a modified polyphenylene ether. These resins may be used in one kind solely, and two kinds or more thereof may be used in combination. Among these, the insulating substrate preferably contains the polyethylene terephthalate. The reason therefor is that excellent insulating properties, size stability and heat resistance can be imparted to the insulating substrate.

The insulating substrate may contain a coloring agent. Examples of the coloring agent may include a white pigment and a dark color pigment. Among them, the white pigment is preferable.

The coloring agent used in the insulating substrate in the present aspect is the same as the explanations of the coloring agent used in the insulating substrate in "α. First aspect A. Solar cell module insulation film I. First embodiment 2. Insulating substrate"; thus, the descriptions herein are omitted.

The insulating substrate can include an additive other than the above as required. Examples of the additive may include a UV-absorbent, a light stabilizer, an antioxidant, an antistatic agent, and a flame retardant agent.

The thickness of the insulating substrate is appropriately set depending on factors such as system voltage required for the solar cell module, but for example, it is preferably 25 μm or more and 300 μm or less, more preferably 38 μm or more and 200 μm or less, and further preferably 50 μm or more and 100 μm or less. When the thickness of the insulating substrate is too thin, there is a possibility that the desired properties such as insulation and design may not be obtained, and there is a possibility that the handling suitability of the solar cell module insulation film may be deteriorated. Also, when the thickness of the insulating substrate is too thick, the rigidity becomes high, and as described later, when the solar cell module insulating film includes a penetration hole, there is a possibility that forming the penetration hole may be difficult. Also, it may be difficult to reduce the thickness and the weight of the solar cell module.

3. Solar Cell Side Sealing Material Layer

The solar cell module insulation film of the present embodiment preferably includes a solar cell side sealing material layer on a surface of the insulating substrate that is opposite to the polyethylene layer.

The solar cell side sealing material layer is not particularly limited if it is usable as a sealing material of the solar cell module, and examples thereof may include a polyolefin layer.

Also, the solar cell side sealing material layer may contain a coloring agent. Examples of the coloring agent may include a dark color pigment. The dark color pigment may be the same as the dark color pigment used for the insulating substrate.

As the polyolefin layer, above all, a non-crosslinking polyolefin layer is preferable. The non-crosslinking polyolefin layer does not require a crosslinking process when a solar cell module is produced using the solar cell module insulation film of the present embodiment, and thus the production cost and the production time can be reduced.

The non-crosslinking polyolefin layer usually does not contain a crosslinking agent. When the polyolefin layer does not contain the crosslinking agent, it can be said it is the non-crosslinking polyolefin layer. In other words, it is preferable that the polyolefin layer does not contain the crosslinking agent.

Note that the analysis method for the presence or absence of the crosslinking agent in the polyolefin layer is as described above.

Also, the gel content of the non-crosslinking polyolefin layer is usually 0%. When the gel content of the polyolefin layer is 0%, it can be said it is the non-crosslinking polyolefin layer.
In other words, it is preferable that the gel content of the polyolefin layer is 0%.

As described later, when the polyolefin layer contains the silane modified resin, it can be said that it is the non-crosslinking polyolefin layer even if the gel content of the polyolefin layer is, for example, 15% or less.

The definition of the gel content and the measurement method of the gel content are as those described above.

(1) Polyolefin Layer

The polyolefin layer in the present embodiment is a member configuring the solar cell side sealing material layer, and is a member disposed on the outermost surface of the solar cell side sealing material layer that is opposite side to the insulating substrate.

(a) Materials of Polyolefin Layer (a) Polyolefin-Based Resin

The polyolefin layer contains a polyolefin-based resin. The polyolefin-based resin is not particularly limited if it can be used as the sealing material of the solar cell module, but above all, from the reasons described above, the non-crosslinking polyolefin-based resin is preferable. Examples of the non-crosslinking polyolefin-based resin may include a polyethylene-based resin, a polypropylene-based resin, a propylene—ethylene copolymer resin, and an ethylene—αolefin copolymer resin. Among those, the polyethylene-based resin is preferable. In other words, the polyolefin layer is preferably the polyethylene layer. The reason therefor is that the polyethylene-based resin is excellent in sealing properties.

The polyethylene-based resin can be the same as the polyethylene-based resin used in the polyethylene layer configuring the wiring sheet side sealing material layer; thus, the explanations herein are omitted.

The polyolefin layer may contain just the polyolefin-based resin as the resin component, and may further contain a resin other than the polyolefin-based resin in addition to the polyolefin-based resin. In the latter case, the polyolefin layer preferably contains the polyolefin-based resin as a main component. Note that the polyolefin layer contains the polyolefin-based resin as the main component means that the ratio of the polyolefin-based resin is the most among all the resin components.

The proportion of the polyolefin-based resin with respect to all the resin components in the polyolefin layer is, for example, 50 mass % or more, may be 60 mass % or more, and may be 70 mass % or more. Also, the proportion of the polyolefin-based resin is, for example, 99 mass % or less, may be 95 mass % or less, and may be 90 mass % or less. The proportion of the polyolefin-based resin may be 100 mass %.

(ii) Silane Modified Resin

In the present embodiment, the polyolefin layer preferably contains a silane modified resin. When the polyolefin layer contains the silane modified resin, properties such as adhesion to the solar cell, strength and durability can be improved. Further, when the polyolefin layer contains the silane modified resin, it is not necessary to include the silane coupling agent for improving adhesion, and thus the thickness of the polyolefin layer can be decreased. Thereby, the overall thickness of the solar cell module insulation film can be decreased. Thus, when the solar cell module insulation film of the present embodiment is used in a solar cell module, the amount of use of a conductive material used for forming a conductive part, which is disposed in a penetration hole of the solar cell module insulation film and electronically connects the electrode of the solar cell and the wiring of the wiring sheet, can be reduced, and the production cost can be reduced. Also, when the solar cell module insulation film of the present embodiment is used in a solar cell module, the thickness and the weight of the solar cell module can be reduced.

Also, when the polyolefin layer is the non-crosslinking polyolefin layer and contains the silane modified resin, it does not contain a crosslinking agent, and it is not necessary to include the silane coupling agent for improving adhesion, and thus the range of heating conditions during production of the solar cell module can be widened. Also, when the polyolefin layer is the non-crosslinking polyolefin layer and contains the silane modified resin, it does not contain the crosslinking agent and it is not necessary to include the silane coupling agent for improving adhesion, and thus it is suitable for layering by the dry laminating method.

The silane modified resin can be the same as the silane modified resin used in the polyethylene layer configuring the wiring sheet side sealing material layer; thus, the explanations herein are omitted.

The content of the silane modified resin in the polyolefin layer can be the same as the content of the silane modified resin in the polyethylene layer configuring the wiring sheet side sealing material layer; thus, the explanations herein are omitted.

Also, the content of silicon atoms in the polyolefin layer can be the same as the content of silicon atoms in the polyethylene layer configuring the wiring sheet side sealing material layer; thus, the explanations herein are omitted.

(iii) Light Stabilizer

Also, the polyolefin layer may contain a light stabilizer. When the polyolefin layer contains the light stabilizer, the ultraviolet ray deterioration of the polyolefin layer can be inhibited. The light stabilizer can be the same as the light stabilizer used in the polyethylene layer configuring the wiring sheet side sealing material layer; thus, the explanations herein are omitted.

The content of the light stabilizer in the polyolefin layer can be the same as the content of the light stabilizer in the polyethylene layer configuring the wiring sheet side sealing material layer; thus, the explanations herein are omitted.

(iv) Other Additives

The polyolefin layer may contain an additive other than the above as required.

(b) Configuration of Polyolefin Layer

The thickness of the polyolefin layer can be the same as the thickness of the polyethylene layer configuring the wiring sheet side sealing material layer; thus, the explanations herein are omitted.

(2) Polypropylene Layer

In the present embodiment, the solar cell side sealing material layer preferably includes a polypropylene layer in the insulating substrate side with respect to the polyolefin layer. For example, in FIG. 6, solar cell side sealing material layer 104 includes polypropylene layer 104*b* between polyolefin layer 104*a* and insulating substrate 102. When the solar cell side sealing material layer includes the polypropylene layer, the solar cell side sealing material layer may have the rigidity usable as a sealing material film. Thus, even when the thickness of the polyolefin layer is thin, inclusion of the polypropylene layer in the solar cell side sealing material layer facilitates handling of the solar cell side sealing material layer. Further, the size stability of the solar cell module insulation film can be improved.

The polypropylene layer can be the same as the polypropylene layer configuring the wiring sheet side sealing material layer; thus, the explanations herein are omitted.

(3) Others

The thickness of the solar cell side sealing material layer can be the same as the thickness of the wiring sheet side sealing material layer; thus, the explanations herein are omitted.

Also, when the solar cell side sealing material layer includes the polyethylene layer and the polypropylene layer, for example, the polyethylene layer and the polypropylene layer may be layered interposing an adhesive layer, and a multilayer film of the polyethylene layer and the polypropylene layer may be formed by a coextrusion method.

Above all, the solar cell side sealing material layer preferably includes a coextrusion film including the polyethylene layer and the polypropylene layer, similarly to the wiring sheet side sealing material layer.

4. First Adhesive Layer

The solar cell module insulation film of the present embodiment may include a first adhesive layer between the insulating substrate and the wiring sheet side sealing material layer. The first adhesive layer is a layer that adheres the insulating substrate and the wiring sheet side sealing material layer.

The first adhesive layer in the present aspect is in the same as the explanations in "α. First aspect A. Solar cell module insulation film I. First embodiment 4. First adhesive layer"; thus, the descriptions herein are omitted.

5. Second Adhesive Layer

The solar cell module insulation film of the present embodiment may include a second adhesive layer between the insulating substrate and the solar cell side sealing material layer. The second adhesive layer is a layer that adheres the insulating substrate and the solar cell side sealing material layer.

The second adhesive layer in the present aspect is the same as the explanations in "α. First aspect A. Solar cell module insulation film I. First embodiment 5. Second adhesive layer"; thus, the descriptions herein are omitted.

6. Penetration Hole

Figure 7:
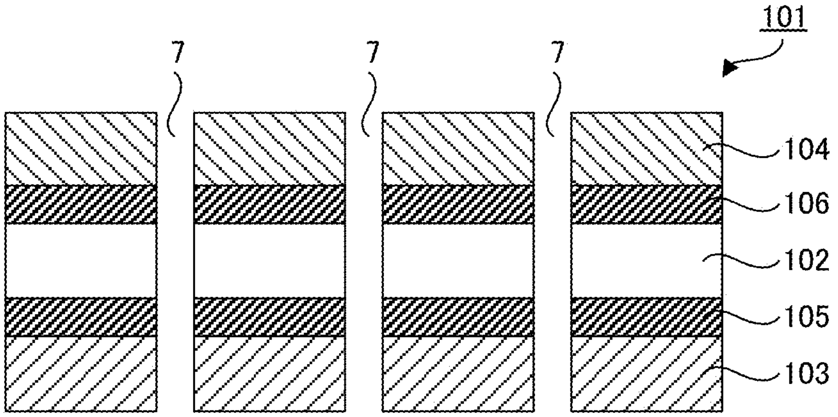
FIG. 7 is a schematic cross-sectional view exemplifying the solar cell module insulation film in the second aspect of the present disclosure.

The solar cell module insulation film of the present embodiment may include a penetration hole in a position corresponding to an electrode of the solar cell and to a wiring of the wiring sheet. For example, in FIG. 7, solar cell module insulation film 101 includes a plurality of penetration hole 7 in the specified positions. In the solar cell module using the solar cell module insulation film of the present embodiment, when a conductive part is disposed in the penetration hole of the solar cell module insulation film, the electrode of the solar cell and the wiring of the wiring sheet can be electronically connected through the conductive part.

The shape of the penetration hole in a plan view is not particularly limited if it is a shape capable of electronically connecting the electrode of the solar cell and the wiring of the wiring sheet by disposing the conductive part in the penetration hole, and it is appropriately set depending on factors such as a shape of the electrode of the solar cell. In specific, the shape of the penetration hole in a plan view may be an arbitrary shape such as a circle shape, an oval shape, and a polygon shape.

Also, the size of the penetration hole in a plan view is not particularly limited if it is a size capable of electronically connecting the electrode of the solar cell and the wiring of the wiring sheet by disposing the conductive part in the penetration hole, and it is appropriately set depending on factors such as a size of the electrode of the solar cell.

Also, the position of the penetration hole in a plan view is not particularly limited if it is capable of electronically connecting the electrode of the solar cell and the wiring of the wiring sheet by disposing the conductive part in the penetration hole, and it is appropriately set depending on factors such as a position of the electrode of the solar cell.

The method for forming the penetration hole is not particularly limited as long as the penetration hole can be formed in the specified position, and examples thereof may include a laser processing, a punching process, a drilling process, and a blanking process.

7. Solar Cell Module Insulation Film

In the present embodiment, when a surface of the solar cell module insulation film that is the wiring sheet side sealing material layer side is thermally compressed to a copper foil, an adhesive force of the wiring sheet side sealing material layer with respect to the copper foil is, for example, preferably 3N/15 mm or more, more preferably 8N/15 mm or more, and further preferably 10N/15 mm or more. When the adhesive force is in the above range, in the case of using the solar cell module insulation film of the present embodiment in a solar cell module, the reliability and durability of the solar cell module can be improved since the adhesion to the solar cell module insulation film and the wiring sheet is excellent.

Here, the adhesive force refers to an average peel force obtained by averaging the measurement result of measurement number N=3 by an adhesion test shown below in accordance with JIS-K-8654-1-1999.

In the adhesion test, a test piece of the solar cell module insulation film cut into a size of 75 mm*50 mm, copper foil having a thickness of 35 μm and a size of 75 mm*50 mm, a glass plate having a size of 75 mm*50 mm, and a sealing material sheet having a thickness of 450 μm, a size of 75 mm*50 mm, of which base resin is a linear low density polyethylene (LLDPE), are used. First, on the glass plate, the sealing material sheet, the test piece of the solar cell module insulation film, and the copper foil are layered in this order. On this occasion, a surface of the solar cell module insulation film that is the wiring sheet side sealing material layer side is faced to the copper foil to adhere to one surface of the copper foil. Also, a release film having a size of 10 mm*75 mm (such as an ethylene-tetrafluoroethylene copolymer (ETFE) film) is inserted to a part between the copper foil and the solar cell module insulation film. Next, a thermal compression by a vacuum laminator is performed with the below laminate conditions. After that, the release film is removed to make a chance of peeling of the below peeling test. Next, to the test piece of the solar cell module insulation film adhered to the copper foil, 180° peeling test at a peeling speed of 50 mm/min is performed using a peeling test machine to measure the adhesive force. The details of the measurement method of the adhesive force are as described in Examples.

<Heat Laminate Conditions>

Vacuum drawing: 5 minutes

Pressing: the pressure was raised from 0 kPa to 100 kPa over 1 minute and 30 seconds.

Pressure keeping (100 kPa): 7.5 minutes

Temperature: 150° C.

In the solar cell module insulation film of the present embodiment, a thermal shrinkage in a MD direction when kept at 150° C. for 30 minutes is, for example, preferably 5% or less, more preferably 3% or less, and further preferably 2% or less. Also, in the solar cell module insulation film of the present embodiment, a thermal shrinkage in a TD direction when kept at 150° C. for 30 minutes is, for example, preferably 5% or less, more preferably 3% or less, and further preferably 2% or less. When the thermal shrinkage of the solar cell module insulation film is in the above range, the size stability of the solar cell module insulation film can be improved. Thereby, as described later, when the solar cell module insulation film includes a penetration hole in a position corresponding to the electrode of the solar cell and to the wiring of the wiring sheet, when the solar cell module insulation film is used in a solar cell module, the positional deviation of the penetration hole of the solar cell module insulation film, the electrode of the solar cell, and the wiring of the wiring sheet, can be inhibited. Meanwhile, the smaller the thermal shrinkage, the more preferable, and the lower limit value of the thermal shrinkage is not particularly limited.

Note that the MD direction of the solar cell module insulation film is usually a longer side direction of the solar cell module insulation film. Also, the TD direction of the solar cell module insulation film is usually a shorter side direction of the solar cell module insulation film.

Here, the thermal shrinkage of the solar cell module insulation film can be measured by, for example, a method in accordance with JIS K7133-1999. The details of the measurement method of the thermal shrinkage of the solar cell module insulation film are as described in Examples.

There are no particular limitations on the method for producing the solar cell module insulation film of the present embodiment, and examples thereof may include a method in which the wiring sheet side sealing material layer, the insulating substrate, and the solar cell side sealing material layer are layered interposing an adhesive agent by the dry laminating method.

II. Second Embodiment

The second embodiment of the solar cell module insulation film in the present aspect includes: an insulating substrate containing at least one kind of resins selected from the group consisting of a polyethylene terephthalate, a polyethylene naphthalate, a polybutylene terephthalate, a polyimide, a polyamide, a polycarbonate, and a modified polyphenylene ether; and a wiring sheet side sealing material layer that is disposed on one surface of the insulating substrate and includes a polyethylene layer, wherein a wetting tension of a surface of the polyethylene layer that is opposite side to the insulating substrate is 36 dyne/cm or more.

FIG. 5 is a schematic cross-sectional view showing an example of the solar cell module insulation film of the present embodiment. As shown in FIG. 5, solar cell module insulation film 101 includes insulating substrate 102, and wiring sheet side sealing material layer 103 that is disposed on one surface of the insulating substrate 102 and includes a polyethylene layer. The insulating substrate 102 contains the specified resin, and also, the surface of the wiring sheet side sealing material layer 103 that is opposite side to the insulating substrate 102 of the polyethylene layer has the specified wetting tension.

As shown in FIG. 5, the solar cell module insulation film 101 of the present embodiment may include solar cell side sealing material layer 104 on a surface of the insulating substrate 102 that is opposite side to the wiring sheet side sealing material layer 103. Also, the solar cell module insulation film 101 of the present embodiment may include first adhesive layer 105 between the insulating substrate 102 and the wiring sheet side sealing material layer 103. Also, the solar cell module insulation film 101 of the present embodiment may include second adhesive layer 106 between the insulating substrate 102 and the solar cell side sealing material layer 104.

The solar cell module insulation film of the present embodiment includes an insulating substrate, and since the insulating substrate contains the specified resin, it is excellent in size stability. Thus, the size stability of the solar cell module insulation film overall improves. Thus, when the solar cell module is produced using the solar cell module insulation film of the present embodiment, after forming a penetration hole in the solar cell module insulation film, in a process of integration by thermal compression, a positional deviation of the penetration hole of the solar cell module insulation film to the electrode of the solar cell and to the wiring of the wiring sheet can be inhibited. Thereby, the reliability of the solar cell module improves.

Also, in the present embodiment, the wiring sheet side sealing material layer includes a polyethylene layer, and the surface of the polyethylene layer that is opposite side to the insulating substrate includes the specified wetting tension, and thus the adhesion to the wiring of the wiring sheet used in the solar cell module can be improved.

Also, the solar cell module insulation film of the present embodiment includes the insulating substrate, and thus the insulation can be improved, and occurrence of short circuit defect of the electrode of the solar cell and the wiring of the wiring sheet can be inhibited.

In the solar cell module insulation film of the present embodiment, the wiring sheet side sealing material layer, the solar cell side sealing material layer, the first adhesive layer, the second adhesive layer, the penetration hole, the properties of the solar cell module insulation film, and the method for producing the solar cell module insulation film can be the same as those in the first embodiment above; thus, the descriptions herein are omitted.

In the solar cell module insulation film of the present embodiment, the insulating substrate contains the specified resin. The resin configuring the insulating substrate can be the same as that in the first embodiment above, thus the descriptions herein are omitted. Also, features such as the material, the thickness and the properties of the insulating substrate can also be same as those in the first embodiment above; thus, the descriptions herein are omitted.

III. Third Embodiment

The third embodiment of the solar cell module insulation film in the present aspect includes an insulating substrate of which thermal shrinkage in a MD direction is 2.0% or less and in a TD direction is 1.5% or less, when kept at 150° C. for 30 minutes; and a wiring sheet side sealing material layer that is disposed on one surface of the insulating substrate and includes a polyethylene layer containing a silane modified resin, wherein a content of silicon atoms in the polyethylene layer is 0.0001 mass % or more and 15.0 mass % or less.

FIG. 5 is a schematic cross-sectional view showing an example of the solar cell module insulation film of the present embodiment. As shown in FIG. 5, the solar cell module insulation film 101 includes insulating substrate 102, and wiring sheet side sealing material layer 103 that is disposed on one surface of the insulating substrate 102 and includes a polyethylene layer containing a silane modified resin. The insulating substrate 102 has the specified thermal shrinkage, and the polyethylene layer configuring the wiring sheet side sealing material layer 103 has the specified content of silicon atoms.

As shown in FIG. 5, the solar cell module insulation film 101 of the present embodiment may include solar cell side sealing material layer 104 on a surface of the insulating substrate 102 that is opposite side to the wiring sheet side sealing material layer 103. Also, the solar cell module insulation film 101 of the present embodiment may include first adhesive layer 105 between the insulating substrate 102 and the wiring sheet side sealing material layer 103. Also, the solar cell module insulation film 101 of the present embodiment may include second adhesive layer 106 between the insulating substrate 102 and the solar cell side sealing material layer 104.

Since the solar cell module insulation film of the present embodiment includes the insulating substrate, the insulating substrate has the specified thermal shrinkage, and is excellent in size stability, the size stability of the solar cell module insulation film overall improves. Thus, when a solar cell module is produced using the solar cell module insulation film of the present embodiment, in a process of integration by thermal compression after forming a penetration hole in the solar cell module insulation film, positional deviation of the penetration hole of the solar cell module insulation film to an electrode of the solar cell and to a wiring of the wiring sheet can be inhibited. Thereby, the reliability of the solar cell module improves.

Also, in the present embodiment, since the wiring sheet side sealing material layer includes the polyethylene layer, the polyethylene layer contains the silane modified resin and the content of the specified silicon atoms, the adhesion to the wiring of the wiring sheet used in the solar cell module improves.

Further, in the present embodiment, since the polyethylene layer contains the silane modified resin, it is not necessary to include a silane coupling agent for improving adhesion, and thus the thickness of the polyethylene layer can be decreased. Thereby, the overall thickness of the solar cell module insulation film can be decreased. Thus, when the solar cell module insulation film of the present embodiment is used in a solar cell module, the amount of use of a conductive material, which is disposed in a penetration hole of the solar cell module insulation film and used for forming a conductive part that electronically connects the electrode of the solar cell and the wiring of the wiring sheet, can be reduced, and the production cost can be reduced. Also, when the solar cell module insulation film of the present embodiment is used in a solar cell module, the thickness and the weight of the solar cell module can be reduced.

Also, the solar cell module insulation film of the present embodiment includes the insulating substrate, and thus the insulation improves, and occurrence of short circuit defect of the electrode of the solar cell and the wiring of the wiring sheet can be inhibited.

In the solar cell module insulation film of the present embodiment, the insulating substrate, the solar cell side sealing material layer, the first adhesive layer, the second adhesive layer, the penetration hole, the properties of the solar cell module insulation film, and the method for producing the solar cell module insulation film can be the same as those in the first embodiment above; thus, the descriptions herein are omitted.

In the solar cell module insulation film of the present embodiment, the wiring sheet side sealing material layer includes a polyethylene layer containing a silane modified resin, and the content of silicon atoms in the polyethylene layer is in the specified range. The polyethylene layer configuring the wiring sheet side sealing material layer can be the same as that of the first embodiment above; thus, the descriptions herein are omitted. Also, features such as the configuration and the thickness of the wiring sheet side sealing material layer can also be the same as those in the first embodiment above; thus, the descriptions herein are omitted.

IV. Fourth Embodiment

The fourth embodiment of the solar cell module insulation film in the present aspect includes an insulating substrate containing at least one kind of resins selected from the group consisting of a polyethylene terephthalate, a polyethylene naphthalate, a polybutylene terephthalate, a polyimide, a polyamide, a polycarbonate, and a modified polyphenylene ether; and a wiring sheet side sealing material layer that is disposed on one surface of the insulating substrate and includes a polyethylene layer containing a silane modified resin, wherein a content of silicon atoms in the polyethylene layer is 0.0001 mass % or more and 15.0 mass % or less.

FIG. 5 is a schematic cross-sectional view showing an example of the solar cell module insulation film of the present embodiment. As shown in FIG. 5, the solar cell module insulation film 101 includes insulating substrate 102, and wiring sheet side sealing material layer 103 that is disposed on one surface of the insulating substrate 102 and includes a polyethylene layer containing a silane modified resin. The insulating substrate 102 has the specified thermal shrinkage, and the polyethylene layer configuring the wiring sheet side sealing material layer 103 has the specified content of silicon atoms.

As shown in FIG. 5, the solar cell module insulation film 101 of the present embodiment may include solar cell side sealing material layer 104 on a surface of the insulating substrate 102 that is opposite side to the wiring sheet side sealing material layer 103. Also, the solar cell module insulation film 101 of the present embodiment may include first adhesive layer 105 between the insulating substrate 102 and the wiring sheet side sealing material layer 103. Also, the solar cell module insulation film 101 of the present embodiment may include second adhesive layer 106 between the insulating substrate 102 and the solar cell side sealing material layer 104.

The solar cell module insulation film of the present embodiment includes an insulating substrate, and since the insulating substrate contains the specified resin, it is excellent in size stability. Thus, the size stability of the solar cell module insulation film overall improves. Thus, when a solar cell module is produced using the solar cell module insulation film of the present embodiment, after forming a penetration hole in the solar cell module insulation film, in a process of integration by thermal compression, a positional deviation of the penetration hole of the solar cell module insulation film to the electrode of the solar cell and to the wiring of the wiring sheet can be inhibited. Thereby, the reliability of the solar cell module improves.

Also, in the present embodiment, since the wiring sheet side sealing material layer includes the polyethylene layer, the polyethylene layer contains the silane modified resin and the specified content of silicon atoms, the adhesion to the wiring of the wiring sheet used in the solar cell module improves.

Further, in the present embodiment, since the polyethylene layer contains the silane modified resin, it is not necessary to include a silane coupling agent for improving adhesion, and thus the thickness of the polyethylene layer can be decreased. Thereby, the overall thickness of the solar cell module insulation film can be decreased. Thus, when the solar cell module insulation film of the present embodiment is used in a solar cell module, the amount of use of a conductive material, which is disposed in a penetration hole of the solar cell module insulation film, and used for forming a conductive part that electronically connects the electrode of the solar cell and the wiring of the wiring sheet, can be reduced, and the production cost can be reduced. Also, when the solar cell module insulation film of the present embodiment is used in a solar cell module, the thickness and the weight of the solar cell module can be reduced.

Also, the solar cell module insulation film of the present embodiment includes the insulating substrate, and thus the insulation improves, and occurrence of short circuit defect of the electrode of the solar cell and the wiring of the wiring sheet can be inhibited.

In the solar cell module insulation film of the present embodiment, the solar cell side sealing material layer, the first adhesive layer, the second adhesive layer, the penetration hole, the properties of the solar cell module insulation film, and the method for producing the solar cell module insulation film can be the same as those in the first embodiment above; thus, the descriptions herein are omitted. Also, the wiring sheet side sealing material layer can be the same as that of the third embodiment above; thus, the descriptions herein are omitted. Also, the insulating substrate can be the same as that of the second embodiment, thus the descriptions herein are omitted.

B. Insulation Film with Wiring Sheet

The insulation film with wiring sheet in the present aspect includes the above described solar cell module insulation film, and a wiring sheet disposed on a surface of the solar cell module insulation film that is a wiring sheet side sealing material layer side.

Figure 8:
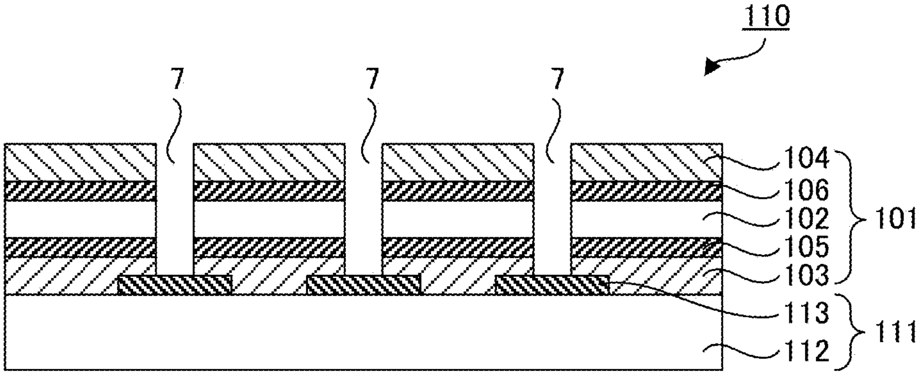
FIG. 8 is a schematic cross-sectional view exemplifying the insulation film with wiring sheet in the second aspect of the present disclosure.

FIG. 8 is a schematic cross-sectional view showing an example of the insulation film with wiring sheet in the present aspect.

As shown in FIG. 8, insulation film with wiring sheet 110 includes solar cell module insulation film 101, and wiring sheet 111 disposed on a surface of the solar cell module insulation film 101 that is wiring sheet side sealing material layer 103 side. The configuration of the solar cell module insulation film 101 is the same as that of the solar cell module insulation film 101 shown in FIG. 5 described above.

In the insulation film with wiring sheet in the present aspect, as shown in FIG. 8, the wiring sheet 111 may include substrate 12, and wiring 13 in a pattern shape disposed on one surface of the substrate 12.

Also, in the insulation film with wiring sheet in the present aspect, as shown in FIG. 8, the solar cell module insulation film 101 may include penetration hole 7 in a position corresponding to an electrode of the solar cell and to the wiring 13 of the wiring sheet 111.

In the present aspect, the above described solar cell module insulation film is included, and thus the positional deviation of the penetration hole of the solar cell module insulation film to the electrode of the solar cell and to the wiring of the wiring sheet can be inhibited, and also, the adhesion of the solar cell module insulation film and the wiring of the wiring sheet can be improved.

Each configuration of the insulation film with wiring sheet in the present aspect will be herein after explained.

1. Solar Cell Module Insulation Film

The solar cell module insulation film in the present aspect is in the same contents as those described in the section "A. Solar cell module insulation film" above; thus, the descriptions herein are omitted.

2. Wiring Sheet

The wiring sheet in the present aspect is a member disposed on a surface of the solar cell module insulation film that is the wiring sheet side sealing material layer side. The wiring sheet may include, a substrate, and a wiring in a pattern shape disposed on one surface of the substrate.

(1) Wiring

Examples of the material of the wiring configuring the wiring sheet may include metals such as copper, gold, and aluminum, and an alloy including these metals. Among those, copper is preferable from the viewpoint of conductivity and cost. Also, for forming the wiring, for example, a metal foil can be used.

There are no particular limitations on the pattern shape of the wiring.

There are no particular limitations on the thickness of the wiring, and it is appropriately set depending on factors such as a level of current resistance required for the wiring sheet. In specific, the thickness of the wiring can be 10 μm or more and 100 μm or less.

There are no particular limitations on the method for forming the wiring, and examples thereof may include a method in which a metal foil is layered on one surface of the substrate interposing an adhesive layer and the metal foil is patterned by etching and the like, and a cold spray method.

(2) Substrate

The substrate configuring the wiring sheet is a substrate with insulation, and for example, a resin substrate can be used. Examples of a resin configuring the resin substrate may include a polyethylene-based resin, a polypropylene-based resin, a cyclic polyolefin-based resin, a polystyrene-based resin, an acrylonitrile-styrene copolymer, an acrylonitrile-butadiene-styrene copolymer, a polyvinyl chloride-based resin, a fluorine-based resin, a poly (meth) acryl-based resin, a polycarbonate-based resin, a polyester-based resin, a polyamide-based resin, a polyimide-based resin, a polyamideimide-based resin, a polyarylphthalate-based resin, a silicone-based resin, a polysulfone-based resin, a polyphenylene sulfide-based resin, a polyether sulfone-based resin, a polyurethane-based resin, an acetal-based resin, and a cellulose-based resin. Examples of the polyester-based resin may include polyethylene terephthalate (PET) and polyethylene naphthalate (PEN). Examples of the polyamide-based resin may include various nylons.

The thickness of the substrate is not particularly limited, and appropriately set depending on factors such as the strength and thickness required for the wiring sheet. In specific, the thickness of the substrate can be 50 μm or more and 500 μm or less.

3. Other Constitutions

The insulation film with wiring sheet in the present aspect may include a backside protective sheet on a surface of the wiring sheet that is opposite side to the solar cell module insulation film.

The backside protective sheet is a member that protects the solar cell. The backside protective sheet may or may not have transparency. The backside protective sheet can be the same as a general backside protective sheet used in a solar cell module; thus, the descriptions herein are omitted.

4. Insulation Film with Wiring Sheet

Examples of the method for producing the insulation film with wiring sheet in the present aspect may include a method in which a layered body including a release film, a solar cell module insulation film, and a wiring sheet is thermally compressed for integration. Examples of the method for the thermal compression may include a vacuum heat laminating method. As the release film, for example, films such as an ethylene-tetrafluoro ethylene copolymer (ETFE) film, and a release polyethylene terephthalate (PET) film may be used.

C. Solar Cell Module

The solar cell module in the present aspect includes a transparent substrate, a sealing material sheet, a solar cell, the above described solar cell module insulation film, and a wiring sheet in this order.

Figure 9:
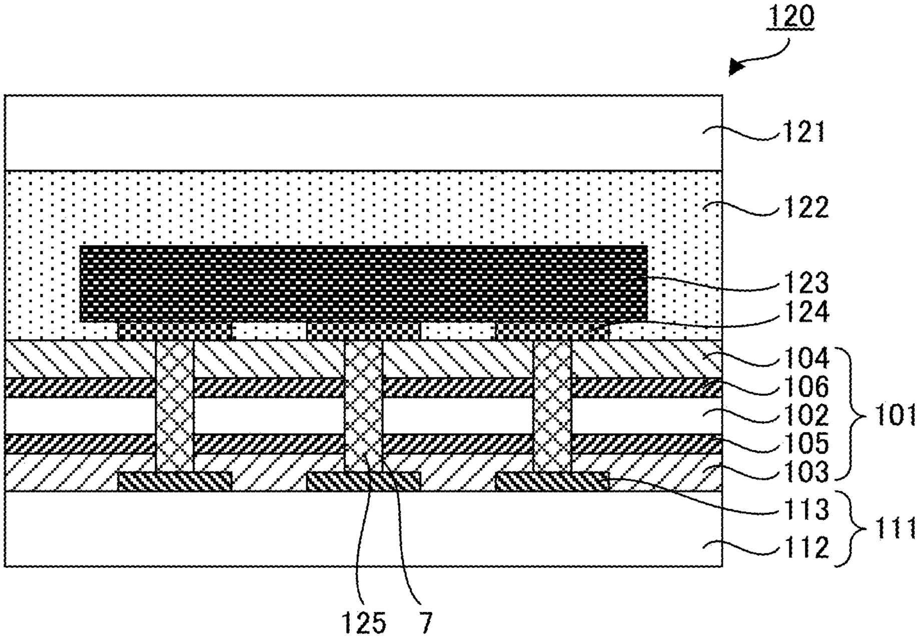
FIG. 9 is a schematic cross-sectional view exemplifying the solar cell module in the second aspect of the present disclosure.

FIG. 9 is a schematic cross-sectional view showing an example of the solar cell module in the present aspect. As shown in FIG. 9, solar cell module 120 includes transparent substrate 121, sealing material sheet 122, solar cell 123, solar cell module insulation film 101, and wiring sheet 111 in this order. The configurations of the solar cell module insulation film 101 and the wiring sheet 111 are the same as those of the solar cell module insulation film 101 and the wiring sheet 111 shown in FIG. 8 described above.

In FIG. 9, in the solar cell 123, both electrodes are disposed on a back surface, and these back electrodes 124 are electronically connected to the wiring 113 of the wiring sheet 111 through conductive part 125 disposed in penetration hole 7 of the solar cell module insulation film 101.

In the present aspect, the above described solar cell module insulation film is included, and thus the positional deviation of the penetration hole of the solar cell module insulation film to the electrode of the solar cell and to the wiring of the wiring sheet can be inhibited, and also, the adhesion of the solar cell module insulation film and the wiring of the wiring sheet improves.

The configuration of the solar cell module in the present aspect will be hereinafter explained.

1. Solar Cell Module Insulation Film

The solar cell module insulation film in the present aspect is in the same contents as those described in the section "A. Solar cell module insulation film" above; thus, the descriptions herein are omitted.

2. Wiring Sheet

The wiring sheet in the present aspect is the same as the wiring sheet described in the section "B Insulation film with wiring sheet" above; thus, the descriptions herein are omitted.

3. Solar Cell

The solar cell in the present aspect is not particularly limited, and examples thereof may include an IBC (Interdigitated Back Contact) type solar cell, a MWT (Metal Wrap Through) type solar cell, and an EWT (Emitter Wrap Through) type solar cell.

Also, there are no particular limitations on the solar cell as long as it is a solar cell applicable to a solar cell module using a wiring sheet. Examples thereof may include crystal-based solar cell.

Features such as the size and the form of the solar cell can be appropriately selected depending on applications of the solar cell module.

4. Conductive Part

The conductive part in the present aspect is a member that is disposed in the penetration hole of the solar cell module insulation film, and electronically connects the electrode of the solar cell and the wiring of the wiring sheet.

As the material of the conductive part, for example, a thermally meltable conductive material can be used, and specific examples thereof may include a conductive paste such as a solder and a silver paste.

5. Transparent Substrate

The transparent substrate in the present aspect is a member that protects the solar cell. Also, the transparent substrate is disposed in a light receiving surface side of the solar cell, and works as a surface protecting member. The transparency of the transparent substrate is not particularly limited if it is to the extent that does not inhibits the power generation of the solar cell. The transparent substrate may be the same as a general transparent substrate used in a solar cell module; thus, the descriptions herein are omitted.

6. Sealing Material Sheet

The sealing material sheet in the present aspect is a member that seals the solar cell. The sealing material sheet is disposed in a light receiving surface side of the solar cell.

The sealing material sheet can be the same as a general sealing material sheet used in a solar cell module; thus, the descriptions herein are omitted.

7. Backside Protective Sheet

The solar cell module in the present aspect may include a backside protective sheet on a surface of the wiring sheet that is opposite side to the solar cell module insulation film.

The backside protective sheet in the present aspect is the same as the backside protective sheet described in the section "B. Insulation film with wiring sheet" above; thus, the descriptions herein are omitted.

8. Method for Producing Solar Cell Module

There are no particular limitations on the method for producing the solar cell module in the present aspect, and for example, first, a conductive material is disposed on the back electrodes of the solar cell. Next, a layered body including the transparent substrate, the sealing material sheet, the solar cell with the conductive material disposed, the solar cell module insulation film including the penetration hole, and the wiring sheet, is thermally compressed for integration. This is an example of the production method. At the time of the thermal compression, the sealing material sheet, and the wiring sheet side sealing material layer and the solar cell side sealing material layer of the solar cell module insulation film are softened and the conductive material melts. Thereby, inside the penetration hole of the solar cell module insulation film is filled with the conductive material, and the electrode of the solar cell and the wiring of the wiring sheet can be electronically connected. Examples of the thermal compression may include a vacuum heat laminating method.

Incidentally, the present disclosure is not limited to the embodiments. The embodiments are exemplification, and any other variations are intended to be included in the technical scope of the present disclosure if they have substantially the same constitution as the technical idea described in the claims of the present disclosure and have similar operation and effect thereto.

EXAMPLES

The present disclosure will be hereinafter further explained showing examples of the first aspect and the second aspect separately.

A. First Aspect

The first aspect will be hereinafter explained with reference to examples.

Examples A-1 to A-4

(1) Preparation of Materials

As the insulating substrate, a polyethylene terephthalate (PET) film having a thickness of 150 μm (AP from DuPont Hongji Films Foshan) was used, as the polyethylene film, a polyethylene film of which one surface was subjected to a corona treatment and having a thickness of 60 μm (SE625N from Tamapoly CO., LTD.) was used, and as an adhesive agent for dry laminating, a two-part adhesive agent (from ROCK PAINT Co., Ltd., main agent: KT-0035, curing agent: H-039Z2) was used. It should be noted that the wetting tension of the corona-treated surface of the polyethylene film was 54 dyne/cm.

(2) Production of Sealing Material Layer

A polyethylene resin composition with the below composition was prepared for forming a polyethylene layer.

<Polyethylene Resin Composition>

Ethylene-α-olefin copolymer ("m-PE KN™ KF260T" from Japan Polyethylene Corporation, density 0.9 g/cm$^3$, melting point 93° C., MFR (A method, 190° C., 2.16 kgf) 2.0 g/10 min): 84 parts by mass Silane modified polyethylene resin ("Linklon™ MF900N" from Mitsubishi Chemical Group Corporation, density 0.9 g/cm$^3$, melting point 83° C., MFR (A method, 190° C., 2.16 kgf) 1.0 g/10 min) 15 parts by mass Weathering agent (HALS) masterbatch: 1 part by mass The weathering agent masterbatch was produced in the following manner. HALS ("Tinuvin® XT850FF" from BASF) and homopolypropylene ("S135" from Prime Polymer Co., Ltd., density 0.9 g/cm$^3$, melting point 165° C., MFR (190° C.) 4.0 g/10 min) were mixed in a mass ratio of 4:96, melted and processed into a pellet to obtain the masterbatch.

Also, a polypropylene resin composition with the below composition was prepared for forming a polypropylene layer.

<Polypropylene Resin Composition>

Homopolypropylene ("S135" from Prime Polymer Co., Ltd., density 0.9 g/cm$^3$, melting point 165° C., MFR (A method, 190° C., 2.16 kgf) 4.0 g/10 min): 63 parts by mass Polypropylene-based elastomer ("TAFMER™ PN2060" from Mitsui Chemicals, Inc., density 0.868 g/cm$^3$, melting point 160° C., MFR (190° C.) 4.0 g/10 min): 10 parts by mass Adhesion improving agent (polyethylene-based elastomer (ethylene-α-olefin copolymer), "TAFMER™ DF110" from Mitsui Chemicals, Inc., density 0.905 g/cm$^3$, melting point 94° C., MFR (A method, 190° C., 2.16 kgf) 1.2 g/10 min): 19 parts by mass Weathering agent (HALS) masterbatch: 8 parts by mass As the weathering agent masterbatch, the above described weathering agent masterbatch was used.

The polyethylene resin composition and the polypropylene resin composition were melted at 190° C. and coextruded using an extrusion machine with a T-die installed, and thereby a sealing material layer configured by a coextrusion film in which a polyethylene layer and a polypropylene layer are layered, was obtained. In the sealing material layer, the thickness of the polyethylene layer was 40 μm and the thickness of the polypropylene layer was 40 μm. After that, a surface of the sealing material layer that is the polypropylene layer side was subjected to a corona treatment.

(3) Production of Solar Cell Module Insulation Film

The adhesive agent for dry laminating was pasted in 5 g/m$^2$ on one surface of the insulating substrate, and bonded to the corona-treated surface of the polyethylene film, and also, the adhesive agent for dry laminating was similarly pasted in 5 g/m$^2$ on the other surface of the insulating substrate, and bonded to the corona-treated surface of the sealing material layer; thereby, a layered body was obtained. Next, the layered body was aged at 50° C. for a week, and thereby the adhesive agent for dry laminating was cured. Then, a corona treatment was performed to a polyethylene film surface of the layered body so as to obtain the wetting tension shown in Table 1.

Comparative Example A-1

A solar cell module insulation film was produced in the same manner as in Example A-1, except that the corona treatment was not performed to the polyethylene film surface of the layered body after obtaining the layered body in Example A-1.

Comparative Example A-2

A solar cell module insulation film was produced in the same manner as in Example A-1, except that regarding the corona treatment to the polyethylene film surface of the layered body in Example A-1, the corona treatment was performed so that the wetting tension of the polyethylene film surface was the value shown in Table 1 below.

Comparative Example A-3

As a solar cell module insulation film, a sealing material seal having a thickness of 450 μm (fast cure EVA from 3M) was solely used.

[Evaluation]

(1) Wetting Tension

The wetting tension of the surface of the polyethylene-based resin layer that is opposite side to the insulating substrate was measured in accordance with JIS K6768 (Plastic film and sheet wetting tension test method). On the occasion of the measurement of the wetting tension, a mixture solution for wetting tension test from Wako Pure Chemical Corporation was used.

(2) Adhesive Force

An adhesion test was respectively performed to the solar cell module insulation films of Examples and Comparative Examples to measure the adhesive force to a steel sheet. In the adhesion test, a test piece of the solar cell module insulation film cut into a size of 75 mmi*100 mm was used. Also, as a steel sheet, an acryl-based coated steel sheet (Galvalume steel sheet "Refarna" from Nippon Steel Corporation) having a thickness of 0.35 mm and a size of 75 mm*50 mm was used. First, the test piece of the solar cell module insulation film was adhered to the steel sheet. On this occasion, regarding Examples A-1 to A-4 and Comparative Examples A-1 to A-2, the polyethylene film side surface of the solar cell module insulation film was faced to the steel sheet side and adhered to the coated surface of the steel sheet. Also, an ethylene-tetrafluoro ethylene copolymer (ETFE) film having a size of 75 mm*60 mm was inserted into a part between the steel sheet and the solar cell module insulation film. Next, a thermal compression by a vacuum laminator was performed with the below laminate conditions. After that, the ETFE film was removed, and a chance of peeling in the below peeling test was made. Then, 180° peeling test at a peeling speed of 50 mm/min was performed to the test piece of the solar cell module insulation film adhered to the steel sheet, using a peeling test machine (TENSILON tension testing machine from A&D Company, Limited), and thereby the adhesive force was measured.

<Heat Laminate Conditions>

Vacuum drawing: 5 minutes

Pressing: Pressure was raised from 0 kPa to 100 kPa over 1 minute and 30 seconds.

Pressure keeping (100 kPa): 7.5 minutes

Temperature: 150° C.

It should be noted that the solar cell module insulation film broke on the occasion of the peeling test was evaluated that the adhesive force was 40N/15 mm or more.

(3) Insulation

Regarding the solar cell module insulation films of Examples and Comparative Examples, insulation was respectively evaluated. In specific, the adhesion test was performed, and those of which insulation was sufficiently obtained after laminating were evaluated as "A", and those of which insulation was insufficient since the thickness of the solar cell module insulation film decreased during laminating were evaluated as "F".

TABLE 1

| | Configuration of insulation film | PE film wetting tension (dyne/cm) | Insulation film Adhesive force (N/15 mm) | Insulation film Insulation |
|---|---|---|---|---|
| Example A-1 | Sealing material layer// Insulating substrate//PE film | 36 | 12.3 | A |
| Example A-2 | Sealing material layer// Insulating substrate//PE film | 40 | 27.1 | A |

TABLE 1-continued

| | Configuration of insulation film | PE film wetting tension (dyne/cm) | Insulation film Adhesive force (N/15 mm) | Insulation film Insulation |
|---|---|---|---|---|
| Example A-3 | Sealing material layer// Insulating substrate//PE film | 46 | 40 or more | A |
| Example A-4 | Sealing material layer// Insulating substrate//PE film | 52 | 40 or more | A |
| Comp. Ex. A-1 | Sealing material layer// Insulating substrate//PE film | less than 30 | — | A |
| Comp. Ex. A-2 | Sealing material layer// Insulating substrate//PE film | 32 | — | A |
| Comp. Ex. A-3 | Sealing material sheet | less than 30 | 40 or more | F |

Example A-5

As the insulating substrate, a white color polyethylene terephthalate (PET) film having a thickness of 50 μm (BP-D from DuPont Hongji Films Foshan) was used, and as a polyethylene film, a polyethylene film (SE625N from Tamapoly CO., LTD.) having a thickness of 60 μm, one of which surface was subjected to a corona treatment, was used. Also, a sealing material layer was produced in the same manner as in Examples A-1 to A-4.

A transparent adhesive agent for dry laminating was pasted on one surface of the insulating substrate, and bonded to the corona-treated surface of the sealing material layer, and also, an adhesive agent for dry laminating including a black color pigment was pasted on the other surface of the insulating substrate, and bonded to the corona-treated surface of the polyethylene film; thereby, a layered body was obtained. Next, the layered body was aged to cure the adhesive agent for dry laminating. Then, the polyethylene film surface of the layered body was subjected to a corona treatment. The wetting tension of the surface of the polyethylene film was 46 dyne/cm. Also, evaluation was performed in the same manner as in Examples A-1 to A-4 and Comparative Examples A-1 to A-3, and it was found out that the adhesive force of the insulation film was 40N/15 mm or more, and the insulation was A.

Regarding the obtained solar cell module insulation films, a reflection rate was measured using a spectrophotometer ("U-4100" from Hitachi High-Tech Corporation). The reflection rate in a visible region was low and exhibited dark color, and the design was excellent. Also, the reflection rate in the infrared ray region was high, and it was suggested that the temperature rise of the solar cell module due to absorption of near-infrared ray and infrared ray can be inhibited.

B. Second Aspect

Next, the second aspect will be explained with reference to examples.

Example B-1

(1) Production of Solar Cell Side Sealing Material Layer and Wiring Sheet Side Sealing Material Layer A polyethylene resin composition with the below composition was prepared for forming a polyethylene layer.

<Polyethylene Resin Composition>

Ethylene-α-olefin copolymer ("m-PE KN™ 260T" from Japan Polyethylene Corporation, density 0.9 g/$cm^3$, melting point 93° C., MFR (190° C.) 2.0 g/10 min): 94 parts by mass Silane modified polyethylene resin ("Linklon™ MF900N" from Mitsubishi Chemical Group Corporation, density 0.9 g/$cm^3$, melting point 83° C., MFR (190° C.) 1.0 g/10 min): 5 parts by mass Weathering agent (HALS) masterbatch: 1 part by mass The weathering agent masterbatch was produced in the following manner. HALS ("Tinuvin® XT850FF" from BASF) and homopolypropylene ("S135" from Prime Polymer Co., Ltd., density 0.9 g/$cm^3$, melting point 165° C., MFR (A method, 190° C., 2.16 kgf) 4.0 g/10 min) were mixed in a mass ratio of 4:96, melted and processed into a pellet to obtain the masterbatch.

Also, a polypropylene resin composition with the below composition was prepared for forming a polypropylene layer.

<Polypropylene Resin Composition>

Homopolypropylene ("S135" from Prime Polymer Co., Ltd., density 0.9 g/$cm^3$, melting point 165° C., MFR (190° C.) 4.0 g/10 min) 63 parts by mass Polypropylene-based elastomer ("TAFMER™ PN2060" from Mitsui Chemicals, Inc., density 0.868 g/$cm^3$, melting point 160° C., MFR (A method, 190° C., 2.16 kgf) 4.0 g/10 min): 10 parts by mass Adhesion improving agent (polyethylene-based elastomer (ethylene-α-olefin copolymer), "TAFMER™ DF110" from Mitsui Chemicals, Inc., density 0.905 g/$cm^3$, melting point 94° C., MFR (A method, 190° C., 2.16 kgf) 1.2 g/10 min): 19 parts by mass Weathering agent (HALS) masterbatch: 8 parts by mass As the weathering agent masterbatch, the above described weathering agent masterbatch was used.

The polyethylene resin composition and the polypropylene resin composition were melted at 190° C. and coextruded using an extruding machine with a T-die installed, and thereby a sealing material layer, in which a polyethylene layer and a polypropylene layer are layered, was obtained. In the sealing material layer, the thickness of the polyethylene layer was 40 μm, and the thickness of the polypropylene layer was 40 μm. Also, two pieces of this sealing material layer were produced and used as the solar cell side sealing material layer and the wiring sheet side sealing material layer.

(2) Production of Solar Cell Module Insulation Film

As the insulating substrate, a white color polyethylene terephthalate (PET) film having a thickness of 50 μm (BP-D from DuPont Hongji Films Foshan) was used.

An adhesive agent for dry laminating including a black color pigment was pasted on one surface of the insulating substrate, and bonded to the polypropylene layer surface of the solar cell side sealing material layer. Also, an adhesive agent for dry laminating was pasted on the other surface of the insulating substrate, and bonded to the polypropylene layer surface of the wiring sheet side sealing material layer, and thereby, a layered body was obtained. Next, the layered body was aged to cure the adhesive agent for dry laminating. Then, the wiring sheet side sealing material layer surface of the layered body was subjected to a corona treatment so as to obtain the wetting tension shown in Table 2.

Example B-2

A solar cell module insulation film was produced in the same manner as in Example B-1, except that the polyethylene resin composition of the below composition was used for forming the polyethylene layer.

<Polyethylene Resin Composition>

Ethylene-α-olefin copolymer ("m-PE KN™ KF260T" from Japan Polyethylene Corporation, density 0.9 g/cm$^3$, melting point 93° C., MFR (A method, 190° C., 2.16 kgf) 2.0 g/10 min): 84 parts by mass Silane modified polyethylene resin ("Linklon™ MF900N" from Mitsubishi Chemical Group Corporation, density 0.9 g/cm$^3$, melting point 83° C., MFR (A method, 190° C., 2.16 kgf) 1.0 g/10 min) 15 parts by mass Weathering agent (HALS) masterbatch: 1 part by mass

Example B-3

A solar cell module insulation film was produced in the same manner as in Example B-1, except that the polyethylene resin composition of the below composition was used for forming the polyethylene layer.

<Polyethylene Resin Composition>

Ethylene-α-olefin copolymer ("m-PE KN™ KF260T" from Japan Polyethylene Corporation, density 0.9 g/cm$^3$, melting point 93° C., MFR (A method, 190° C., 2.16 kgf) 2.0 g/10 min): 50 parts by mass Silane modified polyethylene resin ("Linklon™ MF900N" from Mitsubishi Chemical Group Corporation, density 0.9 g/cm$^3$, melting point 83° C., MFR (A method, 190° C., 2.16 kgf) 1.0 g/10 min) 50 parts by mass Weathering agent (HALS) masterbatch: 1 part by mass

Example B-4

A solar cell module insulation film was produced in the same manner as in Example B-1, except that the insulating substrate was subjected to an annealing treatment in Example B-1.

Comparative Example B-1

A solar cell module insulation film was produced in the same manner as in Example B-1, except that the wiring sheet side sealing material layer surface of the layered body was not subjected to a corona treatment in Example B-1.

Comparative Example B-2

A solar cell module insulation film was produced in the same manner as in Example B-1, except that a sealing material sheet (fast cure EVA from 3M) having a thickness of 450 μm was used as the solar cell side sealing material layer and the wiring sheet side sealing material layer in Example B-1.

Comparative Example B-3

As a solar cell module insulation film, a sealing material sheet (fast cure EVA from 3M) having a thickness of 450 μm was solely used.

[Evaluation]

(1) Wetting Tension of Polyethylene Layer of Wiring Sheet Side Sealing Material Layer The wetting tension of the surface of the polyethylene layer that is opposite side to the insulating substrate was measured in accordance with JIS K6768-1999 (Plastic film and sheet wetting tension test method). On the occasion of the measurement of the wetting tension, a mixture solution for wetting tension test from Wako Pure Chemical Corporation was used.

(2) Content of Silicon Atoms in Polyethylene Layer of Wiring Sheet Side Sealing Material Layer The polyethylene layer was gradually decomposed in a sulfuric acid, and then the temperature was raised to perform a dry decomposition (including alkali fusion treatment) treatment, and the solution in a constant volume was used as a test liquid. Si in the test liquid was determined by an ICP emission spectral analysis (ICP-AES).

(3) Thermal Shrinkage of Insulating Substrate

The thermal shrinkage of the insulating substrate in the MD direction and in the TD direction was respectively measured in accordance with JIS-K-7133-1999. The measurement conditions were at 150° C. and for 30 minutes.

(4) Adhesive Force

The measurement was performed in accordance with JIS-K-8654-2-1999, and the adhesive force was calculated from the below equation.

$$\text{(Dimension after heat treatment} - \text{dimension before heat treatment)/dimension before heat treatment} * 100\%.$$

In specific, the adhesion test was performed to the wiring sheet side sealing material layer of the solar cell module insulation film of Examples and Comparative Examples, and the adhesive force of the wiring sheet side sealing material layer to the copper foil was respectively measured. In the adhesion test, a test piece of the solar cell module insulation film cut into a size of 75 mm*50 mm, a copper foil having a thickness of 35 μm and a size of 75 mm*50 mm, a glass plate having a size of 75 mm*50 mm, and a sealing material sheet ("CVF" from Dai Nippon Printing Co., Ltd.) of which base resin is polyethylene, having a thickness of 450 μm and a size of 775 mm5 mm*50 mm were used. First, on the glass plate, the sealing material sheet, the test piece of the solar cell module insulation film, and the copper foil were layered in this order. On this occasion, the surface of the solar cell module insulation film that is the wiring sheet side sealing material layer side was faced to the copper foil, and adhered to one surface of the copper foil. Also, an ETFE film having a size of 10 mm*75 mm was inserted into a part between the copper foil and the solar cell module insulation film. Next, a thermal compression by a vacuum laminator was performed with the below laminate conditions. After that, the release film was removed, and a chance of peeling of the below peeling test was made. Next, 180° peeling test at the peeling speed of 50 mm/min was performed to the test piece of the solar cell module insulation film adhered to the copper foil using a peeling test machine (TENSILON tensile testing machine from A&D Company, Limited), and thereby the adhesive force was measured.

<Heat Laminate Conditions>

Vacuum drawing: 5 minutes

Pressing: Pressure was raised from 0 kPa to 100 kPa over 1 minute and 30 seconds.

Pressure keeping (100 kPa): 7.5 minutes

Temperature: 150° C.

(5) Size Stability (Thermal Shrinkage) of Insulation Film

The thermal shrinkage of the insulation film in the MD direction and in the TD direction was respectively measured in accordance with JIS K7133-1999. The measurement conditions were at 150° C. and for 30 minutes.

TABLE 2

| | Configuration of insulation film | Wiring sheet side sealing material layer: Wetting tension (dyne/cm) | Wiring sheet side sealing material layer: Silane modified resin | Wiring sheet side sealing material layer: Content of silicon atoms (mass %) | Insulating substrate: Thermal shrinkage (%) MD direction | Insulating substrate: Thermal shrinkage (%) TD direction | Insulation film: Adhesive force (N/15 mm) | Insulation film: Thermal shrinkage (%) MD direction | Insulation film: Thermal shrinkage (%) TD direction | Insulation film: Total thickness (μm) |
|---|---|---|---|---|---|---|---|---|---|---|
| Example B-1 | Solar cell side sealing material layer// Insulating substrate// Wiring sheet side sealing material layer | 54 | Present | 0.02 | 1.0 | 0.2 | 10.6 | 1.1 | 0.3 | 220 |
| Example B-2 | Solar cell side sealing material layer// Insulating substrate// Wiring sheet side sealing material layer | 54 | Absent | 0.06 | 1.0 | 0.2 | 12.3 | 1.1 | 0.3 | 220 |
| Example B-3 | Solar cell side sealing material layer// Insulating substrate// Wiring sheet side sealing material layer | 54 | Present | 0.2 | 1.0 | 0.2 | 20.1 | 1.1 | 0.3 | 220 |
| Example B-4 | Solar cell side sealing material layer// Insulating substrate// Wiring sheet side sealing material layer | 54 | Present | 0.06 | 0.2 | 0.0 | 12.0 | 0.3 | 0.1 | 220 |
| Comp. Ex. B-1 | Solar cell side sealing material layer// Insulating substrate// Wiring sheet side sealing material layer | <30 | Present | 0.06 | 1.0 | 0.2 | — | 1.1 | 0.3 | 220 |
| Comp. Ex. B-2 | Solar cell side sealing material layer// Insulating substrate// Wiring sheet side sealing material layer | <30 | Absent | — | 1.0 | 0.2 | 16.5 | 1.8 | 0.5 | 960 |
| Comp. Ex. B-3 | Sealing material sheet | <30 | Absent | — | — | | 28.1 | 50 | −10 | 450 |

The size stability and the adhesion to the copper foil were excellent in the solar cell module insulation films of Examples B-1 to B-4. Meanwhile, the wetting tension of the polyethylene layer of the wiring sheet side sealing material layer in the solar cell module insulation film of Comparative Examples B-1 was small, and thus inferior in the adhesion to the copper foil. Also, the wetting tension of the wiring sheet side sealing material layer in the solar cell module insulation film of Comparative Example B-2 was small, and the wiring sheet side sealing material layer did not contain the silane modified resin; thus, it was inferior in the adhesion to the copper foil. In addition, the wetting tension in the solar cell module insulation film of Comparative Example B-3 was small, and the silane modified resin was not included; thus, it was inferior in the adhesion to the copper foil.

Also, regarding the solar cell module insulation film of Examples B-1 to B-4, the reflection rate was respectively measured using a spectrophotometer ("U-4100" from Hitachi High-Tech Corporation). All the reflection rates in the visible region were low, all exhibited dark color and the designs were excellent. In addition, all the reflection rates in the infrared ray region were high, and it was suggested that the temperature rise of the solar cell module due to absorption of near-infrared ray and infrared ray can be inhibited.

Reference Examples

The polyethylene layer used as the wiring sheet side sealing material layer in Example B-1 was used, and the corona treatment was performed to the polyethylene layer with different treatment conditions. The wetting tension and the adhesive force of the polyethylene layer after the corona treatment were measured in the same manner as the above. The results are shown in Table 3.

TABLE 3

| | Ref. Ex. 1 | Ref. Ex. 2 | Ref. Ex. 3 | Ref. Ex. 4 | Ref. Ex. 5 |
|---|---|---|---|---|---|
| Corona treatment of polyethylene layer | Not performed | Performed | Performed | Performed | Performed |
| Wetting tension of polyethylene layer (dyne/cm) | <30 | 32 | 36 | 40 | 54 |
| Adhesive force (N/15 mm) | — | — | 8.2 | 11.2 | 12.3 |

That is, in the present disclosure, following inventions are provided.

[1]

A solar cell module insulation film disposed between a solar cell and a steel sheet in a solar cell module, the solar cell module insulation film comprising:

a sealing material layer, an insulating substrate, and a polyethylene-based resin layer, in this order, wherein the polyethylene-based resin layer is a polyethylene film; and a wetting tension of a surface of the polyethylene-based resin layer that is opposite side to the insulating substrate is 36 dyne/cm or more.

[2]

A solar cell module insulation film disposed between a solar cell and a steel sheet in a solar cell module, the solar cell module insulation film comprising:

a sealing material layer, an insulating substrate, and a polyethylene-based resin layer, in this order, wherein a thickness of the polyethylene-based resin layer is 10 μm or more and 300 μm or less; and a wetting tension of a surface of the polyethylene-based resin layer that is opposite side to the insulating substrate is 36 dyne/cm or more.

[3]

The solar cell module insulation film according to [1] or [2], wherein a thickness of the insulating substrate is 25 μm or more and 350 μm or less.

[4]

The solar cell module insulation film according to any one of [1] to [3], wherein, when a surface of the solar cell module insulation film that is the polyethylene-based resin layer side is thermally compressed to a steel sheet, an adhesive force of the polyethylene-based resin layer with respect to the steel sheet is 10N/15 mm or more.

[5]

The solar cell module insulation film according to any one of [1] to [4], wherein the insulating substrate contains at least one kind of resins selected from the group consisting of a polyethylene terephthalate, a polyethylene naphthalate, a polybutylene terephthalate, a polyimide, a polyamide, a polycarbonate, and a modified polyphenylene ether.

[6]

The solar cell module insulation film according to any one of [1] to [5], wherein the sealing material layer includes a polyolefin layer containing a silane modified resin.

[7]

The solar cell module insulation film according to [6], wherein the polyolefin layer is a polyethylene layer, and the sealing material layer includes a polypropylene layer between the polyolefin layer and the insulating substrate.

[8]

The solar cell module insulation film according to [7], wherein the sealing material layer includes a coextrusion film including the polyethylene layer and the polypropylene layer.

[9]

The solar cell module insulation film according to [7] or [8], wherein the polypropylene layer contains an adhesion improving agent.

[10]

The solar cell module insulation film according to any one of [1] to [9], wherein a thickness of the sealing material layer is 50 μm or more and 400 μm or less.

[11]

The solar cell module insulation film according to any one of [1] to [10], further comprising a first adhesive layer between the insulating substrate and the polyethylene-based resin layer.

[12]

The solar cell module insulation film according to any one of [1] to [11], further comprising a second adhesive layer between the insulating substrate and the sealing material layer.

[13]

The solar cell module insulation film according any one of [1] to [12], wherein the insulating substrate contains a coloring agent.

[14]

The solar cell module insulation film according to [12], wherein the second adhesive layer contains a coloring agent.

[15]

An insulation film with a steel sheet comprising:

the solar cell module insulation film according to any one of [1] to [14]; and a steel sheet disposed on a surface of the solar cell module insulation film that is a polyethylene-based resin layer side.

[16]

A solar cell module comprising a transparent substrate, a sealing material sheet, a solar cell, the solar cell module insulation film according to any one of [ ]1 to [ ]14, and a steel sheet in this order.

[17]

A solar cell module insulation film disposed between a solar cell and a wiring sheet in a solar cell module, the solar cell module insulation film comprising:

an insulating substrate of which thermal shrinkage in a MD direction is 2.0% or less and in a TD direction is 1.5% or less, when kept at 150° C. for 30 minutes; and a wiring sheet side sealing material layer that is disposed on one surface of the insulating substrate and includes a polyethylene layer, wherein a wetting tension of a surface of the polyethylene layer that is opposite side to the insulating substrate is 36 dyne/cm or more.

[18]

A solar cell module insulation film disposed between a solar cell and a wiring sheet in a solar cell module, the solar cell module insulation film comprising:

an insulating substrate containing at least one kind of resins selected from the group consisting of a polyethylene terephthalate, a polyethylene naphthalate, a polybutylene terephthalate, a polyimide, a polyamide, a polycarbonate, and a modified polyphenylene ether; and a wiring sheet side sealing material layer that is disposed on one surface of the insulating substrate and includes a polyethylene layer, wherein a wetting tension of a surface of the polyethylene layer that is opposite side to the insulating substrate is 36 dyne/cm or more.

[19]

A solar cell module insulation film disposed between a solar cell and a wiring sheet in a solar cell module, the solar cell module insulation film comprising:

an insulating substrate of which thermal shrinkage in a MD direction is 2.0% or less and in a TD direction is 1.5% or less, when kept at 150° C. for 30 minutes; and a wiring sheet side sealing material layer that is disposed on one surface of the insulating substrate and includes a polyethylene layer containing a silane modified resin, wherein a content of silicon atoms in the polyethylene layer is 0.0001 mass % or more and 15.0 mass % or less.

[20]

A solar cell module insulation film disposed between a solar cell and a wiring sheet in a solar cell module, the solar cell module insulation film comprising:

an insulating substrate containing at least one kind of resins selected from the group consisting of a polyethylene terephthalate, a polyethylene naphthalate, a polybutylene terephthalate, a polyimide, a polyamide, a polycarbonate, and a modified polyphenylene ether; and a wiring sheet side sealing material layer that is disposed on one surface of the insulating substrate and includes a polyethylene layer containing a silane modified resin, wherein a content of silicon atoms in the polyethylene layer is 0.0001 mass % or more and 15.0 mass % or less.

[21]

The solar cell module insulation film according to [17] or [18], wherein the polyethylene layer contains a silane modified resin, and a content of silicon atoms in the polyethylene layer is 0.0001 mass % or more and 15.0 mass % or less.

[22]

The solar cell module insulation film according to [17] or [19], wherein the insulating substrate contains at least one kind of resins selected from the group consisting of a polyethylene terephthalate, a polyethylene naphthalate, a polybutylene terephthalate, a polyimide, a polyamide, a polycarbonate, and a modified polyphenylene ether.

[23]

The solar cell module insulation film according to any one of [17] to [22], wherein the wiring sheet side sealing material layer includes a polypropylene layer between the polyethylene layer and the insulating substrate.

[24]

The solar cell module insulation film according to [23], wherein the wiring sheet side sealing material layer includes a coextrusion film including the polyethylene layer and the polypropylene layer.

[25]

The solar cell module insulation film according to [23] or [24], wherein the polypropylene layer contains an adhesion improving agent.

[26]

The solar cell module insulation film according to any one of [17] to [25], wherein a thickness of the insulating substrate is 25 μm or more and 300 μm or less, and a thickness of the wiring sheet side sealing material layer is 50 μm or more and 400 μm or less.

[27]

The solar cell module insulation film according to any one of [17] to [26], further comprising a solar cell side sealing material layer on a surface of the insulating substrate that is opposite to the polyethylene layer.

[28]

The solar cell module insulation film according to [27], wherein the solar cell side sealing material layer includes a polyolefin layer containing a silane modified resin.

[29]

The solar cell module insulation film according to [28], wherein the polyolefin layer is a polyethylene layer, and the solar cell side sealing material layer includes a polypropylene layer between the polyolefin layer and the insulating substrate.

[30]

The solar cell module insulation film according to [29], wherein the solar cell side sealing material layer includes a coextrusion film including the polyethylene layer and the polypropylene layer.

[31]

The solar cell module insulation film according to [29] or [30], wherein the polypropylene layer contains an adhesion improving agent.

[32]

The solar cell module insulation film according to any one of [27] to [31], wherein a thickness of the solar cell side sealing material layer is 50 μm or more and 400 μm or less.

[33]

The solar cell module insulation film according to any one of [17] to [32], further comprising a first adhesive layer between the insulating substrate and the wiring sheet side sealing material layer.

[34]

The solar cell module insulation film according to any one of [27] to [33], further comprising a second adhesive layer between the insulating substrate and the solar cell side sealing material layer.

[35]

The solar cell module insulation film according to any one of [17] to [34], wherein the insulating substrate contains a coloring agent.

[36]

The solar cell module insulation film according to [34], wherein the second adhesive layer contains a coloring agent.

[37]

The solar cell module insulation film according to any one of [17] to [36], wherein, when a surface of the solar cell module insulation film that is the wiring sheet side sealing material layer side is thermally compressed to a copper foil, an adhesive force of the wiring sheet side sealing material layer with respect to the copper foil is 3N/15 mm or more.

[38]

The solar cell module insulation film according to any one of [17] to [37], wherein a thermal shrinkage in a MD direction is 5% or less and a thermal contraction in a TD direction is 5% or less, when kept at 150° C. for 30 minutes.

[39]

The solar cell module insulation film according to any one of [17] to [38], further comprising a penetration hole in a position corresponding to an electrode of the solar cell and to a wiring of the wiring sheet.

[40]

An insulation film with wiring sheet comprising:

the solar cell module insulation film according to [39]; and a wiring sheet disposed on a surface of the solar cell module insulation film that is the wiring sheet side sealing material layer side.

[41]

A solar cell module comprising a transparent substrate, a sealing material sheet, a solar cell, the solar cell module insulation film according to [39], and a wiring sheet in this order.

Also, in the present disclosure, the following invention is provided, too.

A solar cell module insulation film disposed between a solar cell and a wiring sheet in a solar cell module, the solar cell module insulation film comprising:

an insulating substrate of which thermal shrinkage in a MD direction is 2.0% or less and in a TD direction is 1.5% or less, when kept at 150° C. for 30 minutes; and a wiring sheet side sealing material layer that is disposed on one surface of the insulating substrate and includes a polyethylene layer, wherein a wetting tension of a surface of the polyethylene layer that is opposite side to the insulating substrate is 36 dyne/cm or more.

REFERENCE SINGS LIST

Reference Signs of First Aspect

1 solar cell module insulation film
2 sealing material layer
2*a* polyolefin layer
2*b* polypropylene layer
3 insulating substrate
4 polyethylene-based resin layer
5 first adhesive layer
6 second adhesive layer
10 insulation film with steel sheet
11 steel sheet
20 solar cell module
21 transparent substrate
22 sealing material sheet
23 solar cell Reference Signs of Second Aspect

101 solar cell module insulation film
102 insulating substrate
103 wiring sheet side sealing material layer
103*a* polyethylene layer
103*b* polypropylene layer
104 solar cell side sealing material layer
104*a* polyolefin layer
104*b* polypropylene layer
105 first adhesive layer
106 second adhesive layer
7 penetration hole
110 insulation film with wiring sheet
111 wiring sheet
120 solar cell module
121 transparent substrate

The invention claimed is:

1. A solar cell module insulation film disposed between a solar cell and a steel sheet in a solar cell module, the solar cell module insulation film comprising:

a sealing material layer, an insulating substrate, a polyethylene-based resin layer, and the steel sheet, in this order, wherein the polyethylene-based resin layer is a polyethylene film and is in direct contact with the steel sheet; and a wetting tension of a surface of the polyethylene-based resin layer that is opposite side to the insulating substrate is 36 dyne/cm or more.

2. The solar cell module insulation film according to claim 1, wherein a thickness of the insulating substrate is 25 μm or more and 350 μm or less.

3. The solar cell module insulation film according to claim 1, wherein the polyethylene-based resin layer is thermally compressed to the steel sheet, and an adhesive force of the polyethylene-based resin layer with respect to the steel sheet is 10N/15 mm or more.

4. The solar cell module insulation film according to claim 1, wherein the insulating substrate contains at least one kind of resin selected from the group consisting of a polyethylene terephthalate, a polyethylene naphthalate, a polybutylene terephthalate, a polyimide, a polyamide, a polycarbonate, and a modified polyphenylene ether.

5. The solar cell module insulation film according to claim 1, wherein the sealing material layer includes a polyolefin layer containing a silane modified resin.

6. The solar cell module insulation film according to claim 5, wherein the polyolefin layer is a polyethylene layer, and the sealing material layer includes a polypropylene layer between the polyolefin layer and the insulating substrate.

7. The solar cell module insulation film according to claim 6, wherein the sealing material layer includes a coextrusion film including the polyethylene layer and the polypropylene layer.

8. The solar cell module insulation film according to claim 6, wherein the polypropylene layer contains an adhesion improving agent.

9. The solar cell module insulation film according to claim 1, wherein a thickness of the sealing material layer is 50 μm or more and 400 μm or less.

10. The solar cell module insulation film according to claim 1, further comprising a first adhesive layer between the insulating substrate and the polyethylene-based resin layer.

11. The solar cell module insulation film according to claim 1, further comprising a second adhesive layer between the insulating substrate and the sealing material layer.

12. The solar cell module insulation film according to claim 1, wherein the insulating substrate contains a coloring agent.

13. The solar cell module insulation film according to claim 11, wherein the second adhesive layer contains a coloring agent.

14. A solar cell module comprising a transparent substrate, a sealing material sheet, a solar cell, and the solar cell module insulation film according to claim 1 in this order.

15. A solar cell module insulation film disposed between a solar cell and a steel sheet in a solar cell module, the solar cell module insulation film comprising:

a sealing material layer, an insulating substrate, a polyethylene-based resin layer, and a steel sheet, in this order, wherein a thickness of the polyethylene-based resin layer is 10 μm or more and 300 μm or less;

the polyethylene-based resin layer is in direct contact with the steel sheet; and a wetting tension of a surface of the polyethylene-based resin layer that is opposite side to the insulating substrate is 36 dyne/cm or more.

* * * * *